(12) United States Patent
Elsherbini et al.

(10) Patent No.: US 11,239,155 B2
(45) Date of Patent: Feb. 1, 2022

(54) CONDUCTIVE CONTACT STRUCTURES FOR ELECTROSTATIC DISCHARGE PROTECTION IN INTEGRATED CIRCUITS

(71) Applicant: Intel Corporation, Santa Clara, CA (US)

(72) Inventors: Adel A. Elsherbini, Chandler, AZ (US); Feras Eid, Chandler, AZ (US); Johanna M. Swan, Scottsdale, AZ (US); Aleksandar Aleksov, Chandler, AZ (US); Veronica Aleman Strong, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 16/724,346

(22) Filed: Dec. 22, 2019

(65) Prior Publication Data

US 2021/0193571 A1 Jun. 24, 2021

(51) Int. Cl.
| | |
|---|---|
| *H01L 23/522* | (2006.01) |
| *H01L 23/498* | (2006.01) |
| *H01L 23/528* | (2006.01) |
| *H01L 23/552* | (2006.01) |
| *H01L 23/00* | (2006.01) |
| *H01L 27/02* | (2006.01) |

(52) U.S. Cl.
CPC .... *H01L 23/5226* (2013.01); *H01L 23/49816* (2013.01); *H01L 23/528* (2013.01); *H01L 23/552* (2013.01); *H01L 24/14* (2013.01); *H01L 27/0248* (2013.01)

(58) Field of Classification Search
CPC . H01L 23/5226; H01L 23/552; H01L 23/528; H01L 27/0248; H01L 24/14; H01L 23/49816
See application file for complete search history.

(56) References Cited

U.S. PATENT DOCUMENTS

| | | | | |
|---|---|---|---|---|
| 6,172,666 | B1 * | 1/2001 | Okura | H01H 13/702 345/168 |
| 2001/0051447 | A1 * | 12/2001 | Usami | H01L 23/5329 438/790 |
| 2005/0127419 | A1 * | 6/2005 | Hashimoto | H01L 27/0207 257/296 |
| 2016/0128217 | A1 * | 5/2016 | Yoo | H04M 1/0274 361/731 |

* cited by examiner

*Primary Examiner* — Marcos D. Pizarro
*Assistant Examiner* — Sue Tang
(74) *Attorney, Agent, or Firm* — Patent Capital Group

(57) ABSTRACT

Disclosed herein are structures, devices, and methods for electrostatic discharge protection (ESDP) in integrated circuits (ICs). In some embodiments, an IC component may include a conductive contact structure that includes a first contact element and a second contact element. The first contact element may be exposed at a face of the IC component, the first contact element may be between the face of the IC component and the second contact element, the second contact element may be spaced apart from the first contact element by a gap, and the second contact element may be in electrical contact with an electrical pathway in the IC component.

14 Claims, 10 Drawing Sheets

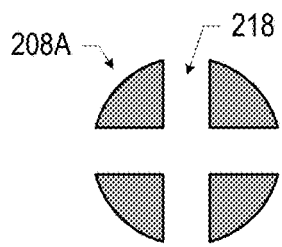
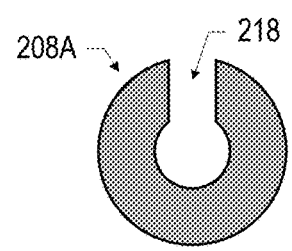
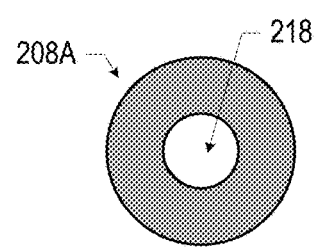
FIG. 24　　　　FIG. 25　　　　FIG. 26
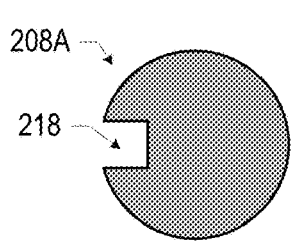
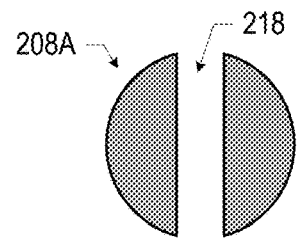
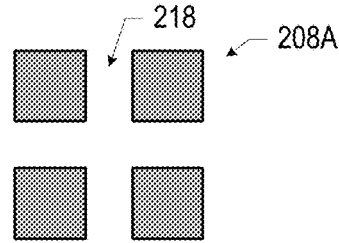
FIG. 27　　　　FIG. 28　　　　FIG. 29
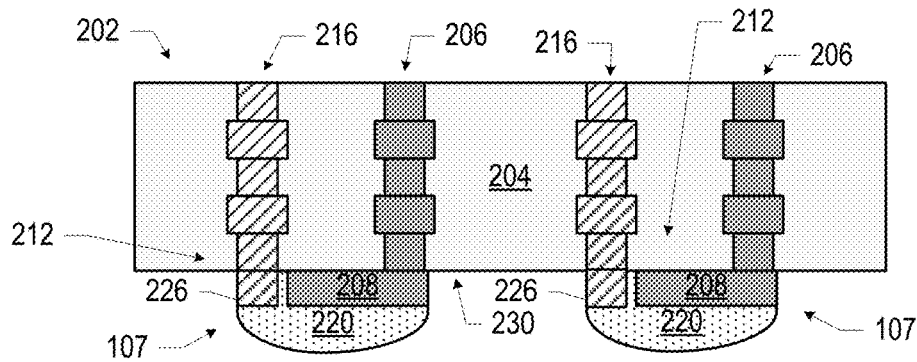
FIG. 30
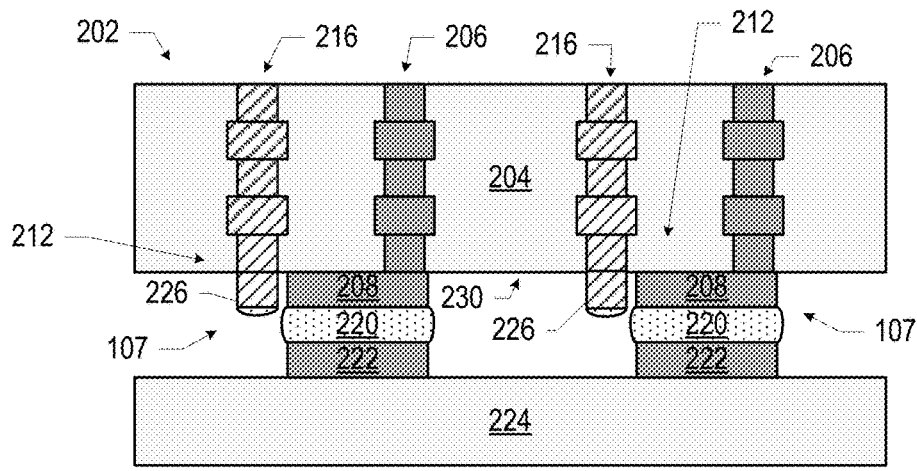
FIG. 31

CONDUCTIVE CONTACT STRUCTURES FOR ELECTROSTATIC DISCHARGE PROTECTION IN INTEGRATED CIRCUITS

BACKGROUND

At various stages in the manufacture of an integrated circuit (IC) device, the electronic components of the device may be at risk for damage due to electrostatic discharge. Electrostatic forces may accumulate during manufacturing, handling, and testing, and discharge of these forces may cause permanent damage to sensitive circuits.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 13-31 illustrate examples of ESDP contact structures, in accordance with various embodiments.

DETAILED DESCRIPTION

Figure 1:
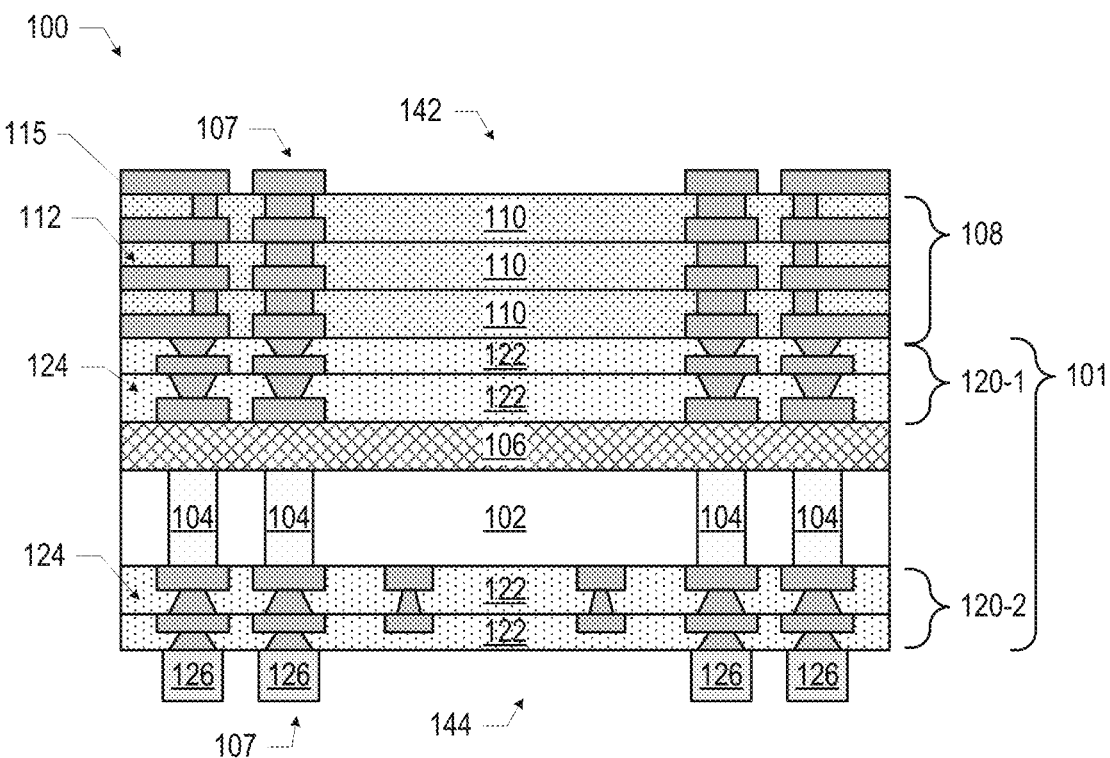
FIGS. 1-6 are side, cross-sectional views of example integrated circuit (IC) structures including electrostatic discharge protection (ESDP) contact structures, in accordance with various embodiments.

Disclosed herein are structures, devices, and methods for electrostatic discharge protection (ESDP) in integrated circuits (ICs). In some embodiments, an IC component may include a conductive contact structure that includes a first contact element and a second contact element. The first contact element may be exposed at a face of the IC component, the first contact element may be between the face of the IC component and the second contact element, the second contact element may be spaced apart from the first contact element by a gap, and the second contact element may be in electrical contact with an electrical pathway in the IC component.

Conventionally, IC devices have been protected from electrostatic discharge by diodes included in the device layer of a die. These diodes have been electrically coupled between exposed locations of the die (e.g., exposed conductive contacts, such as first-level interconnect (FLI) solder bumps) and a ground (e.g., the bulk semiconductor upon which device layers are conventionally fabricated). Such diodes may be designed such that their forward bias voltage is just below the voltage threshold at which the functional devices on the die (e.g., the transistors) may be damaged. When a voltage in the expected operational voltage range is applied at the exposed locations, the diode may act as a capacitor between the exposed location and ground, and any signal received at the exposed location will be transmitted to the functional devices as expected. When an external voltage greater than or equal to this value is applied at the exposed locations, the diode will be forward-biased, shunting the high voltage input to ground and shielding the functional devices.

Continued use of this conventional approach to ESDP, however, becomes more difficult as the size of IC devices continues to shrink. Such on-die diodes may have a large footprint, requiring a significant portion of the valuable "real estate" of the underlying semiconductor material or other substrate. Such diodes may induce capacitive loading and consume leakage power during normal device operation, undesirably increasing the power consumption of such devices and limiting the frequencies at which the devices can operate. Further, conventional diode arrangements may relay on the presence of a bulk semiconductor to serve as the ground, and thus cannot be readily applied in silicon-on-insulator (SOI) or thinned substrate devices.

The ESDP contact structures and techniques disclosed herein may protect IC devices from electrostatic discharge without occupying expensive on-die real estate and/or without substantially impacting high frequency performance. Further, the ESDP contact structures and techniques disclosed herein may be readily customized to provide the kind of ESDP that is most advantageous at each of the different structural levels of an electronic device (e.g., with protection against smaller voltages at the die-level, and against greater voltages at the package- or circuit board-level).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

FIGS. 1-6 are side, cross-sectional views of example IC structures 100 including ESDP contact structures 107, in accordance with various embodiments. Although FIGS. 1-6 depict a particular number and arrangement of ESDP contact structures 107 in various IC structures 100, these numbers and arrangements are simply illustrative, and any of the IC structures 100 of FIGS. 1-6 may include any desired number and arrangement of ESDP contact structures 107. Further, the ESDP contact structures 107 included in an IC structure 100 (or in an IC package support 168, as discussed further below) may take any suitable form (e.g., any of the forms discussed below with reference to FIGS. 13-31).

Figure 2:
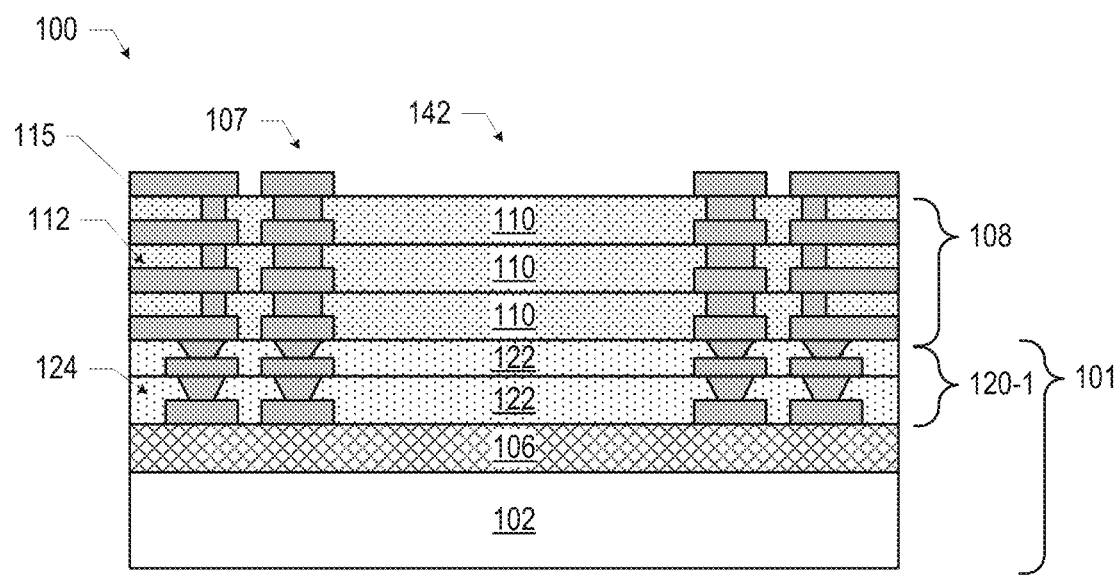
Figure 3:
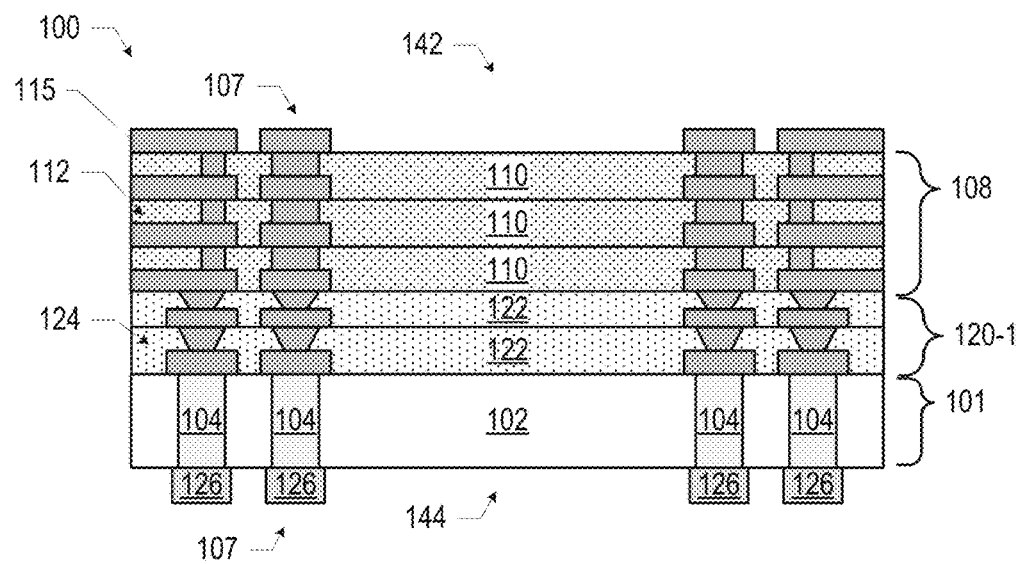
Figure 4:
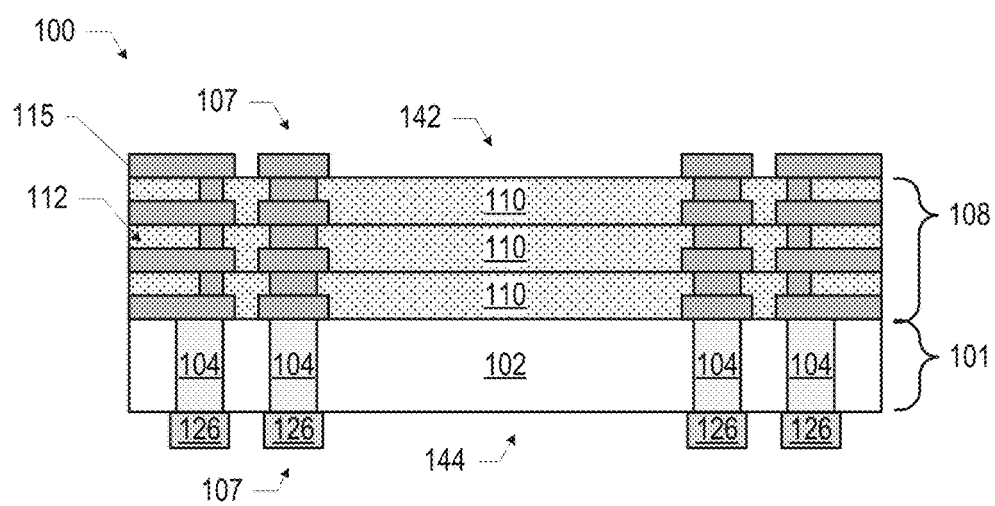
Figure 5:
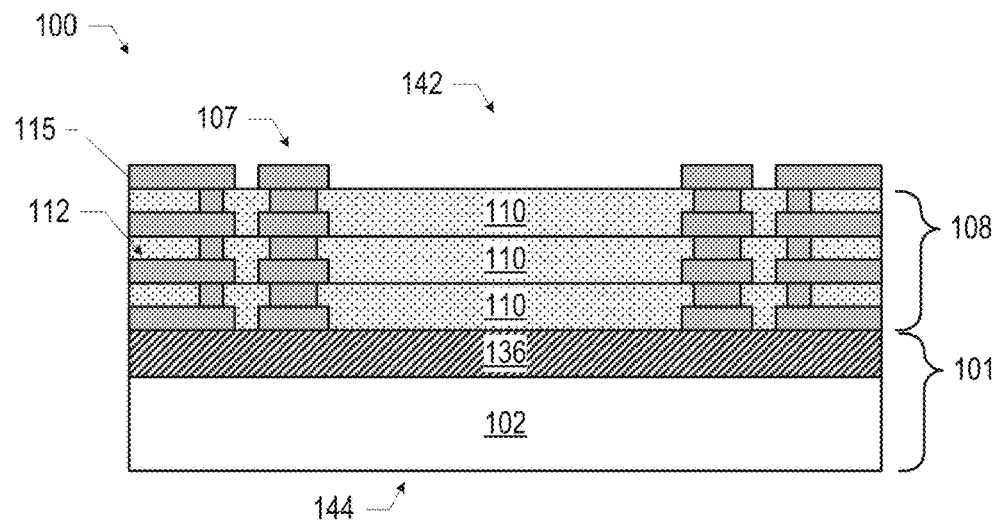

In some embodiments, an IC structure 100 may include a die 101 with redistribution layers (RDLs) 108. A die 101 may include a substrate 102, and may, in some embodiments, include one or more device layers 106 and/or one or more interconnect layers 120. For example, in the embodiment illustrated in FIG. 1, the die 101 includes a device layer 106 proximate to one face (e.g., the "frontside") of the substrate 102, interconnect layers 120-1 proximate to that same face of the substrate 102 (such that the device layer 106 is between the interconnect layers 120-1 and the substrate 102), and RDLs 108 on the interconnect layers 120-1 (such that the interconnect layers 120-1 are between the RDLs 108 and the device layer 106). Further, in the embodiment illustrated in FIG. 1, the die 101 includes interconnect layers 120-2 proximate to the opposite face (e.g., the "backside") of the substrate 102 as the interconnect layers 120-1. In other embodiments, the device layer(s) 106 and/or the interconnect layer(s) 120 may be omitted; for example, FIGS. 3-5 illustrate IC structures 100 in which no device layer 106 is present, and FIGS. 4-5 illustrate IC structures 100 in which no interconnect layers 120 are present. In some embodiments, an IC structure 100 may include one or more device layers 106 and one or more frontside interconnect layers 120 without including any backside interconnect layers 120 (e.g., as illustrated in FIGS. 2-6). Some embodiments (not illustrated) of the IC structure 100 may include no device layers 106 but may include one or more frontside interconnect layers 120 and/or one or more backside interconnect layers 120. More generally, a die 101 including any desired combination of device layer(s) 106 and frontside and/or backside interconnect layers 120 may be used in an IC structure 100.

The substrate 102 may include any suitable material (e.g., an inorganic material). In some embodiments, the substrate 102 may be a semiconductor substrate composed of semiconductor material systems including, for example, n-type or p-type materials systems (or a combination of both). The substrate 102 may include, for example, a crystalline substrate formed using a bulk silicon or a SOI substructure. In some embodiments, the substrate 102 may be formed using alternative materials, which may or may not be combined with silicon, that include but are not limited to germanium, indium antimonide, lead telluride, indium arsenide, indium phosphide, gallium nitride, gallium arsenide, or gallium antimonide. Further materials classified as group II-VI, III-V, or IV may also be included in the substrate 102. In some embodiments, the substrate 102 may include glass, diamond, sapphire, or a ceramic material. In some embodiments, the substrate 102 may advantageously include glass or silicon. As discussed further below, the substrate 102 may be part of a singulated die (e.g., the dies 1502 of FIG. 32) or a wafer (e.g., the wafer 1500 of FIG. 32).

Through-substrate vias (TSVs) 104 may extend through the substrate 102, providing electrical pathways across the substrate 102. The TSVs 104 may include an electrically conductive material (e.g., a metal) and may make contact with electrically conductive structures at opposite faces of the substrate 102. In some embodiments, no TSVs 104 may be present (e.g., as discussed below with reference to FIGS. 2, 5, and 6).

When present in a die 101, a device layer 106 may include one or more transistors (e.g., metal oxide semiconductor field-effect transistors (MOSFETs)), one or more diodes (e.g., for ESDP, as discussed above), or other suitable devices. For example, a device layer 106 may include transistors having source and/or drain (S/D) regions, a gate to control current flow in the transistors between the S/D regions, and one or more S/D contacts to route electrical signals to/from the S/D regions. The transistors may further include additional features, such as device isolation regions, gate contacts, and the like. The transistors in a device layer 106 may include any desired type of transistors, such as planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

The gate of a transistor in a device layer 106 may include at least two layers: a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions may be proximate to the gate of each transistor. The S/D regions may be formed using an implantation/diffusion process or an etching/deposition process, for example. In the former process, dopants such as boron, aluminum, antimony, phosphorous, or arsenic may be ion-implanted into a substrate to form the S/D regions. An annealing process that activates the dopants and causes them to diffuse farther into the substrate may follow the ion-implantation process. In the latter process, a substrate may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions may be formed using one or more alternate semiconductor materials such as germanium or a group III-V material or alloy. In further embodiments, one or more layers of metal and/or metal alloys may be used to form the S/D regions.

As noted above, in some embodiments, an IC structure 100 may include frontside interconnect layers 120-1 and/or backside interconnect layers 120-2. Electrical signals, such as power and/or input/output (I/O) signals, may be routed to and/or from the devices (e.g., the transistors and/or diodes) of the device layer 106, or otherwise to and/or from the die 101, through these interconnect layers 120. For example, electrically conductive features of the device layer 106 (e.g., gate and S/D contacts, or diode contacts) may be electrically coupled to electrical pathways 124 through the interconnect layers 120. A set of interconnect layers 120 may also be referred to as a metallization stack.

Conductive lines and/or vias may be arranged within the interconnect layers 120 to route electrical signals along electrical pathways 124 according to a wide variety of designs. In particular, the arrangement is not limited to the particular configuration of conductive lines and vias depicted in FIG. 1 or any of the other accompanying drawings.

Lines and vias in the interconnect layers 120 may include an electrically conductive material such as a metal. The lines may be arranged to route electrical signals in a direction of a plane that is substantially parallel with a surface of the substrate 102. For example, the lines may route electrical signals in a direction in and out of the page from the perspective of FIG. 1. The vias may be arranged to route electrical signals in a direction of a plane that is substantially perpendicular to the surface of the substrate 102. In some embodiments, the vias may electrically couple lines of different interconnect layers 120 together.

The interconnect layers 120 may include a dielectric material 122 disposed between the lines and vias, as shown in FIG. 1. In some embodiments, the dielectric material 122 may be an inorganic dielectric material, such as silicon oxide. In some embodiments, the dielectric material 122 disposed between the lines and vias in different ones of the interconnect layers 120 may have different compositions (e.g., may be different inorganic dielectric materials); in other embodiments, the composition of the dielectric material 122 of different interconnect layers 120 may be the same.

Although the lines and the vias of the interconnect layers 120 are structurally delineated with a line within each interconnect layer 120 for the sake of clarity, the lines and the vias may be structurally and/or materially contiguous (e.g., simultaneously filled during a dual-damascene process) in some embodiments. In some embodiments, the thickness of the individual interconnect layers 120 may increase with the distance from the substrate 102 (e.g., the frontside interconnect layers 120-1 may increase in thickness closer to the front face 142, and the backside interconnect layers 120-2 may increase in thickness closer to the back face 144).

RDLs 108 may be disposed at a face of the die 101. The RDLs 108 may include a dielectric material 110 and electrical pathways 112 through the dielectric material 110; the electrical pathways 112 may include conductive lines and/or vias embedded in the dielectric material 110, and vias may electrically couple lines in different ones of the RDLs 108, as discussed above with reference to the interconnect layers 120. In some embodiments, the dielectric material 110 may be an organic dielectric material; examples of organic dielectric materials 110 may include organic build-up films (e.g., including an organic matrix with an inorganic particle filler, such as silica-filled epoxides), polyimides with or without filler, benzocyclobutene polymers, or unfilled epoxides. Although a particular number of RDLs 108 (i.e., three) is depicted in FIG. 1 and others of the accompanying drawings, an IC structure 100 may include any desired number of RDLs 108.

The IC structure 100 may include one or more conductive contacts 115 on the RDLs 108. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). In FIG. 1, the conductive contacts 115 are illustrated as taking the form of bond pads, but this is simply for ease of illustration, and the conductive contacts 115 may take any desired form. In particular, one or more of the conductive contacts 115 may be ESDP contact structures 107, discussed further below and examples of which are provided in FIGS. 13-31. In some embodiments, none of the conductive contacts 115 may be ESDP contact structures 107, and ESDP may be provided in the IC structure 100 by other means (e.g., ESDP contact structures 107 serving as one or more of the conductive contacts, 126, as discussed below, or ESDP diodes in the device layer 106). The conductive contacts 115 may be electrically coupled with the electrical pathways 112 of the RDLs 108 and may route the electrical signals of the device layer 106 and/or other electrical signals (e.g., electrical signals received at the conductive contacts 126) to other external devices (e.g., via land grid array (LGA) interconnects or ball grid array (BGA) interconnects, as discussed further below). A surface dielectric material (e.g., a polyimide or similar material, not shown) may be present around the conductive contacts 115, as suitable.

In some embodiments, the IC structure 100 may include one or more conductive contacts 126 on the back face 144 of the IC structure 100. In some embodiments, a surface dielectric material (not shown) may also be present. In FIG. 1, the conductive contacts 126 are illustrated as taking the form of pillars (e.g., copper pillars), but this is simply for ease of illustration, and the conductive contacts 126 may take any desired form. In particular, one or more of the conductive contacts 126 may be ESDP contact structures 107, discussed further below and examples of which are provided in FIGS. 13-31. In some embodiments, none of the conductive contacts 126 may be ESDP contact structures 107, and ESDP may be provided in the IC structure 100 by other means (e.g., ESDP contact structures 107 serving as one or more of the conductive contacts 115, as discussed above, or ESDP diodes in the device layer 106). The conductive contacts 126 may be electrically coupled with the electrical pathways 124 of the backside interconnect layers 120-2 (when the backside interconnect layers 120-2 are present) or the TSVs 104 (when the backside interconnect layers 120-2 are not present) and may route the electrical signals of the device layer 106 and/or other electrical signals (e.g., electrical signals received at the conductive contacts 115) to other external devices.

As noted above, in some embodiments, an IC component (e.g., an IC structure 100 or an IC package support 168, discussed further below) may include one or more ESDP contact structures 107 (e.g., as one or more of the conductive contacts 115 or 126 of an IC structure 100, as one or more of the conductive contacts 184 or 186 of an IC package support 168 as discussed further below, etc.). When an IC component is handled, transported, or subject to further manufacturing operations, the potential exists for the IC component to experience voltages far larger than those for which the IC component was designed; such voltages may arise from electrostatic discharge or other sources, and as noted above, may damage sensitive circuitry in the IC component or sensitive circuitry in other structures coupled to the IC component. An ESDP contact structure 107 may be a structure included in a IC component that may (1) controllably cause an electrical short (i.e., a zero or low resistance path) between a signal pathway (including, e.g., I/O ports) and a ground (or supply rail) pathway when the component is not in use, and may controllably remove the electrical short between the signal pathway and the ground (or supply rail) pathway during use of the component in order to permit normal function of the component; or (2) isolate the signal pathways in the component from voltages present at conductive elements at the face of the component until the component is in use (e.g., during testing or operation). The ESDP contact structures 107 disclosed herein, then, may help protect sensitive signal circuitry from large voltages arising from static electricity or handling that may otherwise render the signal circuitry inoperative by shorting signal lines to ground when the component is at risk for such voltages, and may otherwise permit normal operation. During use of the component, ESDP may be provided by diodes or other ESDP components included in a circuit board or elsewhere in the larger electronic device, and thus the protection provided by the ESDP contact structure 107 may no longer be needed. Any of the ESDP contact structures 107 disclosed herein may be included in any suitable IC component (e.g., a die, an interposer, a bridge, a package substrate, a cable, etc.) and may provide protection for the component itself and/or for other components to which it is coupled. In some embodiments, ESDP contact structures 107 may be utilized at the I/O ports of a component and the power/ground ports of a component may be provided by conventional contact structures, as the power/ground ports and the circuitry coupled thereto may be at less of a risk of electrostatic discharge damage. FIGS. 13-31 illustrate various examples of ESDP contact structures 107 that may serve as the conductive contacts for any one or more of the IC structures 100 and/or IC package supports 168 disclosed herein.

As noted above, FIGS. 2-6 illustrate other example embodiments of the IC structure 100. The example IC structures 100 of FIGS. 2-6 depict particular conductive contacts illustrated with the reference numeral "107," but this is simply to indicate that one or more of those conductive contacts may take the form of an ESDP contact structure 107, and any desired arrangement of ESDP contact structures 107 may be used. In FIG. 2, the IC structure 100 includes many of the features of the IC structure 100 of FIG. 1, but does not include TSVs 104, backside interconnect layers 120-2, or backside conductive contacts 126. The IC structure 100 of FIG. 2 may thus be a "single-sided" structure (i.e., with conductive contacts at only one face of the IC structure 100), while the IC structure 100 of FIG. 1 may be a "double-sided" structure (i.e., with conductive contacts at opposing faces of the IC structure 100).

In the IC structures 100 of FIGS. 3-5, no device layer 106 may be present. For example, in FIG. 3, the IC structure 100 includes backside conductive contacts 126 that are in electrical contact with the TSVs 104, which are in electrical contact with the electrical pathways 124 of frontside interconnect layers 120. Some of the electrical pathways 124 may also be in electrical contact with the electrical pathways 112 of the RDLs 108. The IC structure 100 of FIG. 4 is similar to that of FIG. 3, but does not include interconnect layers 120; the backside conductive contacts 126 are in electrical contact with the TSVs 104, which are in electrical contact with the electrical pathways 112 of the RDLs 108.

The IC structure 100 of FIG. 5 is similar to that of FIG. 4, but does not include any TSVs 104 and does include a barrier material 136 between the substrate 102 and the RDLs 108. The barrier material 136 may be selected to limit diffusion between the substrate 102 and the dielectric material 110; for example, when the substrate 102 includes silicon, the barrier material 136 may include silicon nitride. An IC structure 100 like that of FIG. 4 may be particularly advantageous as an interposer (e.g., an embedded interposer in an organic package substrate) between different dies or other electronic components coupled to the front face 142.

Figure 6:
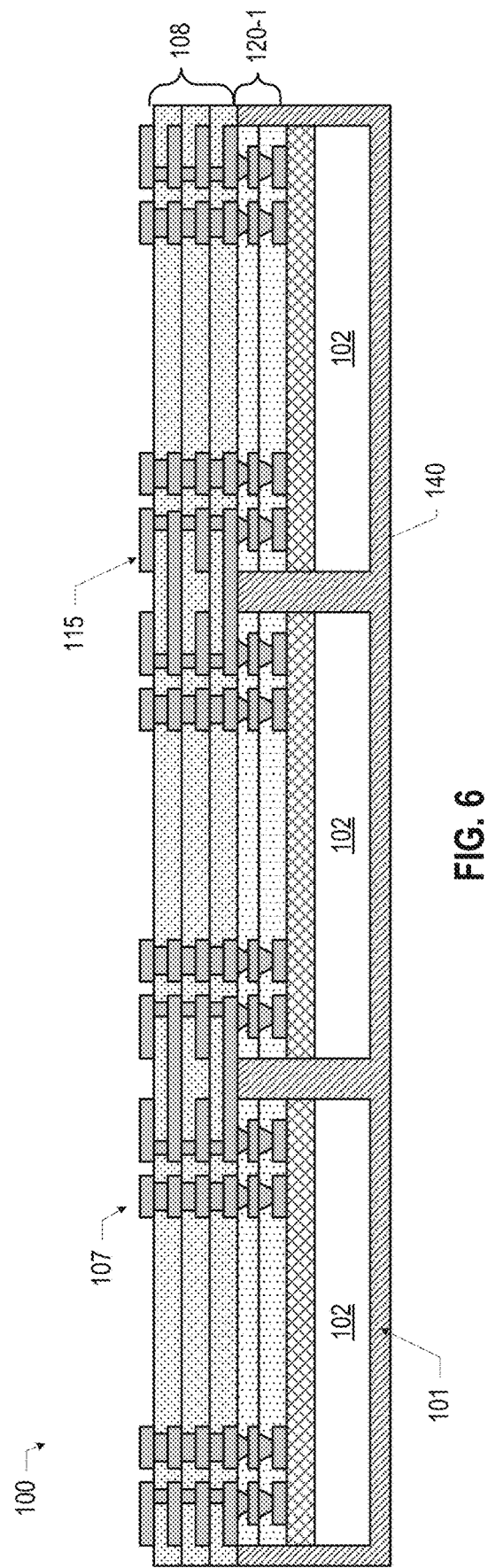

FIG. 6 illustrates a "reconstituted die" embodiment of the IC structure 100. In particular, FIG. 6 illustrates multiple dies 101 electrically coupled by a set of RDLs 108 that span the multiple dies 101. A dielectric material 140 (e.g., a mold compound, silicon dioxide, a spin-on glass, etc.) may be disposed laterally around the dies 101, allowing the IC structure 100 of FIG. 6 to be handled and managed as if it were a single "die."

The ESDP contact structures 107 disclosed herein may be included in an IC package support 168, instead of or in addition to being included in an IC structure 100. As used herein, an "IC package support" may refer to a component of an IC package that provides mechanical and/or electrical support to other IC devices in the IC package. Examples of IC package supports 168 may include package substrates, interposers, and/or bridges, examples of which are discussed below with reference to FIGS. 8-12. Any of the ESDP contact structures 107 disclosed herein may be included in an IC package support 168 in any suitable arrangement (e.g., at one or both of the faces 182 and 188 as the conductive contacts 184 and 186, respectively). The example IC package supports 168 of FIG. 7 depict particular conductive contacts illustrated with the reference numeral "107," but this is simply to indicate that one or more of those conductive contacts may take the form of an ESDP contact structure 107, and any desired arrangement of ESDP contact structures 107 may be used.

Figure 7:
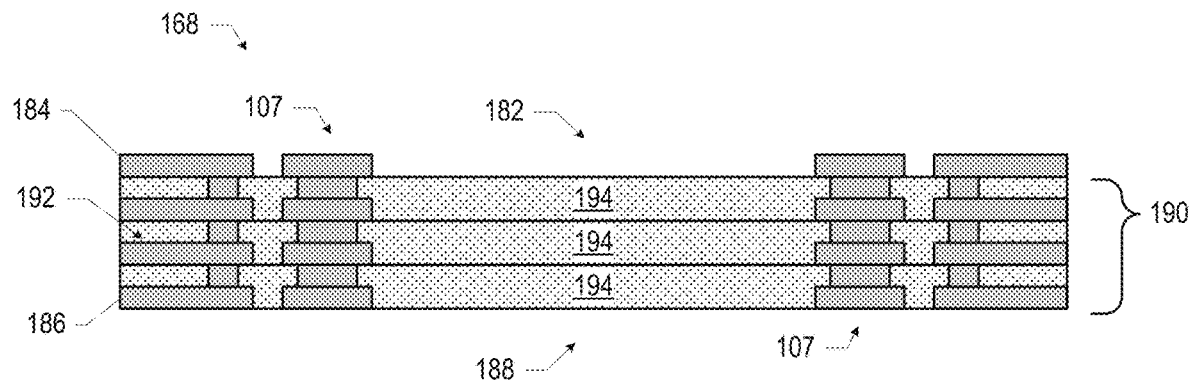
FIG. 7 is a side, cross-sectional view of an example IC package support including ESDP contact structures, in accordance with various embodiments.

FIG. 7 is a side, cross-sectional view of an example IC package support 168 including one or more ESDP contact structures 107. The IC package support 168 may include interconnect layers 190 including a dielectric material 194 and electrical pathways 192 through the dielectric material 194; the electrical pathways 192 may include conductive lines and/or vias embedded in the dielectric material 194, and vias may electrically couple lines in different ones of the interconnect layers 190, as discussed above with reference to the RDLs 108. In some embodiments, the dielectric material 194 may be an organic dielectric material; examples of organic dielectric materials may include organic build-up films, or glass-reinforced epoxy laminate material (e.g., a woven fiberglass cloth with an epoxy resin binder). Although a particular number of interconnect layers 190 (i.e., three) is depicted in FIG. 7, an IC package support 168 may include any desired number of interconnect layers 190. In some embodiments, an IC package support 168 may be manufactured using conventional printed circuit board (PCB) techniques. In some embodiments, some or all of the vias and/or lines included in the electrical pathways 192 may be manufactured using a lithographic via technique.

An IC package support 168 may include a surface dielectric material (e.g., polyimide or similar material, not shown) and one or more conductive contacts 184 and 186 at opposing faces 182 and 188, respectively. In some embodiments, the conductive contacts 184 may be FLIs, and the conductive contacts 186 may be second-level interconnects (SLIs). The conductive contacts 186 may be, for example, BGA or LGA contacts. The conductive contacts 184 and 186 may be electrically coupled with the electrical pathways 192 and may route electrical signals accordingly.

One or more IC structures 100, and/or one or more IC package supports 168, may be included in an IC assembly 150. FIGS. 8-12 illustrate various examples of IC assemblies 150 including ESDP contact structures 107, but these particular examples are not exhaustive, and any of the IC structures 100 and/or the IC package supports 168 disclosed herein may be combined with any other suitable components in any other suitable manner to form an IC assembly 150.

For example, any of the IC structures 100 and/or IC package supports 168 (or, more generally, any of the ESDP contact structures 107 disclosed herein) may be included in a cable (e.g., in a cable connector) with the ESDP contact structures 107 therein providing controllable ESDP in the cable. Although FIGS. 8-12 depict ESDP contact structures 107 in each element of the IC assemblies 150, this is simply an example, and ESDP contact structures 107 may be included in some but not all elements of the IC assembly 150. For example, in some embodiments, ESDP contact structures 107 may be included in the IC structure 100-2 of the IC assembly 150 of FIG. 8, but not in the IC structure 100-1 (or vice versa). In another example, in some embodiments, ESDP contact structures 107 may be included in the IC package support 168 of the IC assembly 150 of FIG. 9, but not in the IC structure 100 (or vice versa). Further, any of the IC assemblies 150 of any of FIGS. 8-12 may be combined as desired to form further IC assemblies 150. The reference numeral "107" is omitted from FIGS. 8-12 for clarity of illustration, but any of the conductive contacts 115, 126, 184, and/or 186 may be an ESDP contact structure 107, as desired.

Figures 8, 9:
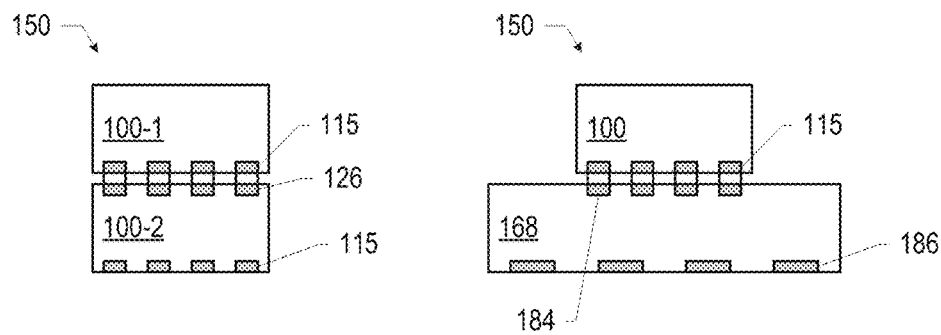
FIGS. 8-12 are side, cross-sectional views of example IC assemblies including ESDP contact structures, in accordance with various embodiments.

FIG. 8 illustrates an IC assembly 150 including a single-sided IC structure 100-1 coupled to a double-sided IC structure 100-2 (e.g., by solder). In some embodiments, the IC structure 100-1 of FIG. 8 may be the IC structures 100 of FIG. 2, 5, or 6, and the IC structure 100-2 of FIG. 8 may be the IC structures 100 of FIG. 1, 3, or 4. As noted above, in some embodiments, the IC structure 100-1 may include ESDP contact structures 107 while the IC structure 100-2 does not include ESDP contact structures 107 (or vice versa). In some embodiments, the IC structure 100-2 may be referred to as an "interposer"; if the IC structure 100-2 includes a device layer 106 (or otherwise includes active devices, such as transistors), the IC structure 100-2 may be referred to as an "active interposer," and if the IC structure 100-2 does not include a device layer 106 (or otherwise does not include active devices), the IC structure 100-2 may be referred to as a "passive interposer." In some embodiments, an IC structure 100 that does not include any ESDP contact structures 107 may instead include diodes for ESDP purposes, or may not include such diodes. Although FIG. 8 illustrates a single IC structure 100-1 coupled to the IC structure 100-2, multiple IC structures 100-1 may be coupled to the IC structure 100-2, as desired.

FIG. 9 illustrates an IC assembly 150 including a single-sided IC structure 100 coupled to an IC package support 168 (e.g., by solder). In some embodiments, the IC structure 100 of FIG. 9 may be the IC structures 100 of FIG. 2, 5, or 6; in other embodiments, the IC structure 100 of the IC assembly 150 of FIG. 9 may be a double-sided IC structure 100-1 (e.g., the IC structure 100 of FIG. 1, 3, or 4) and further IC structures (not shown) may be coupled "on top" of the IC structure 100. As noted above, in some embodiments, the IC structure 100 may include ESDP contact structures 107 while the IC package support 168 does not include ESDP contact structures 107 (or vice versa). In some embodiments, the IC package support 168 of FIG. 9 may be referred to as a "package substrate," and the IC assembly 150 may be referred to as an "IC package" and may in turn be coupled to a circuit board or other component. In some embodiments, the IC package support 168 of FIG. 9 may be an interposer between the IC structure 100 and another component (e.g., an IC structure 100 or an IC package support 168). Although FIG. 9 illustrates a single IC structure 100 coupled to the IC package support 168, multiple IC structures 100 may be coupled to the IC package support 168, as desired.

Figure 10:
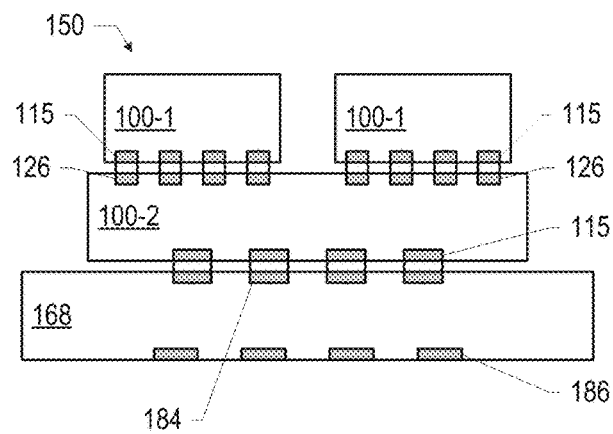

FIG. 10 illustrates an IC assembly 150 including single-sided IC structures 100-1 coupled to a double-sided IC structure 100-2 (e.g., by solder). The double-sided IC structure 100-2 is also coupled to an IC package support 168 (e.g., by solder). In some embodiments, the IC structures 100-1 of FIG. 10 may be the IC structures 100 of FIG. 2, 5, or 6; in other embodiments, the IC structures 100-1 of the IC assembly 150 of FIG. 10 may be double-sided IC structures 100-1 (e.g., the IC structure 100 of FIG. 1, 3, or 4) and further IC structures (not shown) may be coupled "on top" of the IC structures 100-1. In some embodiments, the IC structure 100-2 may be the IC structures 100 of FIG. 1, 3, or 4. As noted above, in some embodiments, one or more of the IC structures 100 may include ESDP contact structures 107 while the IC package support 168 does not include ESDP contact structures 107 (or vice versa). In some embodiments, the IC structure 100-2 of FIG. 10 may be referred to as an interposer (e.g., as discussed above with reference to FIG. 8), while the IC package support 168 may be referred to as a package substrate. In some embodiments, the IC assembly 150 may include an IC package support 168 in the place of the IC structure 100-2, instead of the IC structure 100-2.

Figure 11:
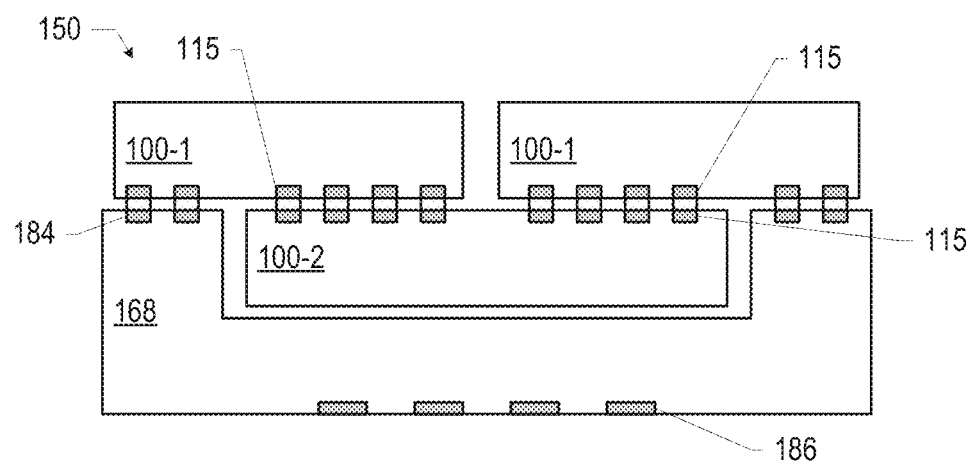

FIG. 11 illustrates an IC assembly 150 including single-sided IC structures 100-1 coupled to another single-sided IC structure 100-1 (e.g., by solder) and also to an IC package support 168 (e.g., by solder). In the IC assembly 150 of FIG. 11, the IC structure 100-2 may be referred to as a "bridge" (e.g., an "embedded bridge" due to the disposition of the IC structure 100-2 in a cavity of the IC package support 168). In some embodiments, the IC structures 100 of FIG. 11 may be the IC structures 100 of FIG. 2, 5, or 6. As noted above, in some embodiments, one or more of the IC structures 100 may include ESDP contact structures 107 while the IC package support 168 does not include ESDP contact structures 107 (or vice versa).

Figure 12:
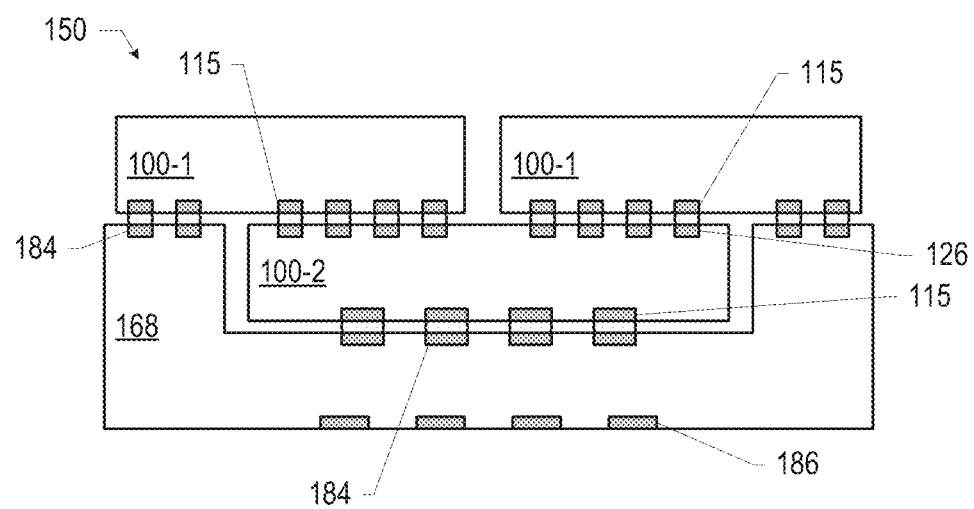

FIG. 12 illustrates an IC assembly 150 similar to the IC assembly 150 of FIG. 11 but in which the IC structure 100-2 is a double-sided IC structure (e.g., the IC structure 100 of FIG. 1, 3, or 4) and is also coupled to the IC package support 168 (e.g., by solder). In such an arrangement, the IC structure 100-2 may be a double-sided bridge.

Figure 32:
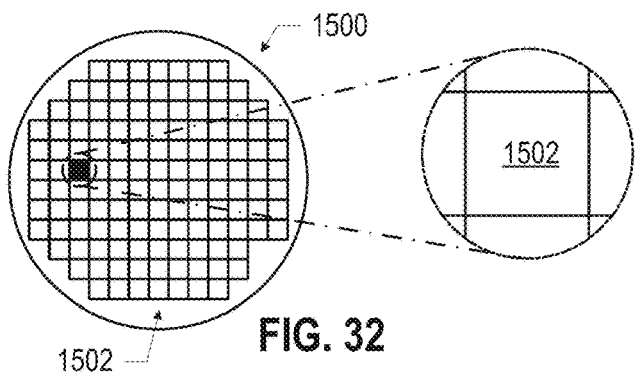
FIG. 32 is a top view of a wafer and dies that may include IC structures, in accordance with any of the embodiments disclosed herein.
Figure 33:
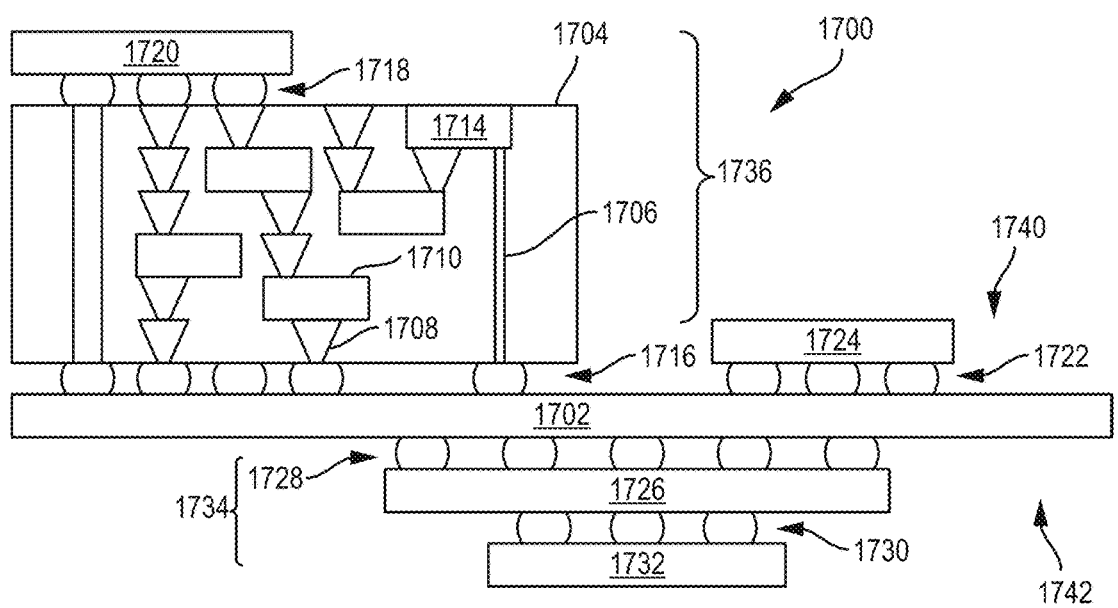
FIG. 33 is a side, cross-sectional view of an IC device assembly that may include IC structures, IC assemblies, IC package supports, and/or ESDP contact structures, in accordance with any of the embodiments disclosed herein.
Figure 34:
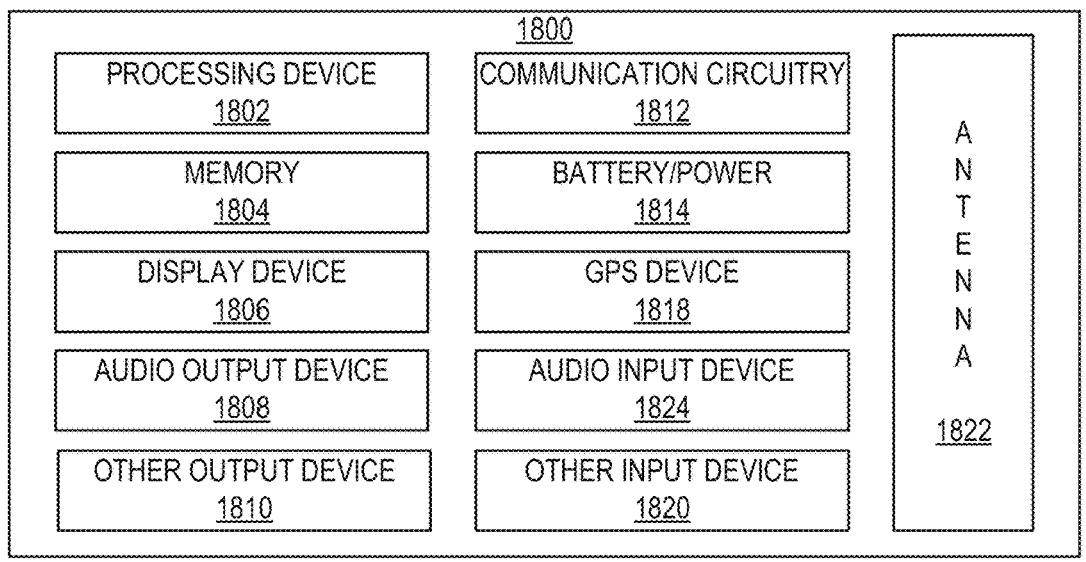
FIG. 34 is a block diagram of an example electrical device that may include IC structures, IC assemblies, IC package supports, and/or ESDP contact structures, in accordance with any of the embodiments disclosed herein.

The IC structures 100, IC assemblies 150, IC package supports 168, and/or ESDP contact structures 107 disclosed herein may include, or may be included in, any suitable electronic component. FIGS. 32-34 illustrate various examples of apparatuses that may include, or be included in, any of the IC structures 100, IC assemblies 150, IC package supports 168, and/or ESDP contact structures 107 disclosed herein, as appropriate.

FIGS. 13-31 illustrate various examples of ESDP contact structures 107 that may be utilized in any of the IC components disclosed herein. Some of the ESDP contact structures 107 may controllably cause an electrical short between a signal pathway (including, e.g., I/O ports) and a ground pathway when the component is not in use, and may controllably remove the electrical short between the signal pathway and the ground pathway during use of the component in order to permit normal function of the component, while others of the ESDP contact structures 107 isolate the signal pathways in the component from voltages present at conductive elements at the face of the component until the component is in use (e.g., during testing or operation).

The ESDP contact structures 107 of FIGS. 13-31 may be discussed with reference to an IC component 202; when the ESDP contact structures 107 are included in an IC structure 100, the IC component 202 may be the IC structure 100, and when the ESDP contact structures 107 are included in an IC package support 168, the IC component 202 may be the IC package support 168. The ESDP contact structures 107 of FIGS. 13-31 may be discussed with reference to pathways 206 and 216; when the ESDP contact structures 107 are included in an IC structure 100, the pathways 206 and 216 may be parts of electrical pathways 112, and when the ESDP contact structures 107 are included in an IC package support 168, the pathways 206 and 216 may be parts of electrical pathways 192. The particular pathways 206 and 216 depicted in FIGS. 13-31 are simply illustrative, and pathways 206 and 216 that are part of an IC component 202 may have any suitable form. The ESDP contact structures 107 of FIGS. 13-31 are also discussed with reference to a dielectric material 204; when the ESDP contact structures 107 are included in an IC structure 100, the dielectric material 204 may be the dielectric material 110 (e.g., one or more layers of the dielectric material 110), and when the ESDP contact structures 107 are included in an IC package support 168, the dielectric material 204 may be the dielectric material 194 (e.g., one or more layers of the dielectric material 194).

The contact elements 208 discussed below with reference to FIGS. 13-31 may be formed of an electrically conductive material, such as a metal (e.g., copper). In some embodiments, the contact elements 208 may include a surface finish to mitigate corrosion; some examples of surface finish materials may include platinum, gold, silver, or organic materials. In some embodiments, the ESDP contact structures 107 included in an IC component 202 may be manufactured as part of the process for forming the remainder of the IC component 202 (e.g., RDL or PCB manufacturing processes, with reactive ion etching or a sacrificial dielectric used to form any gaps 212, or laser or mechanical drilling to form any openings 218, as appropriate), while in other embodiments, the ESDP contact structures 107 may be separately manufactured and coupled to the remainder of the IC component 202 as a layer of multiple ESDP contact structures 107 or individually/in groups (e.g., via a surface mount process). In some embodiments, the ground pathways 216 discussed below with reference to various ones of FIGS. 13-31 may be a shared ground path with a large resistance in order to mitigate the risk of charge build-up.

Figure 13:
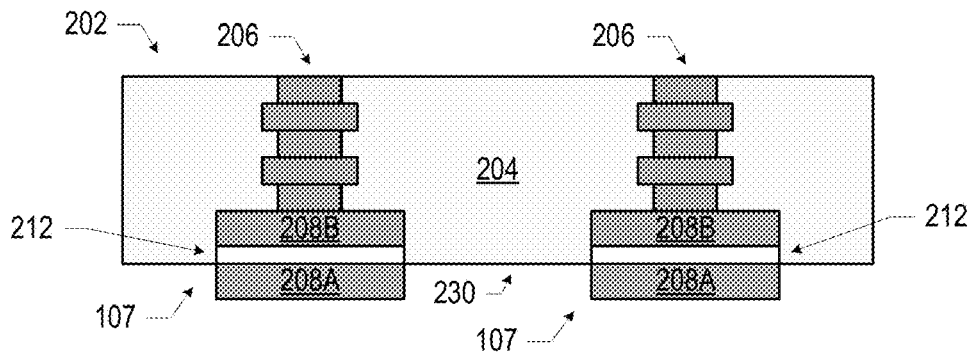
Figure 14:
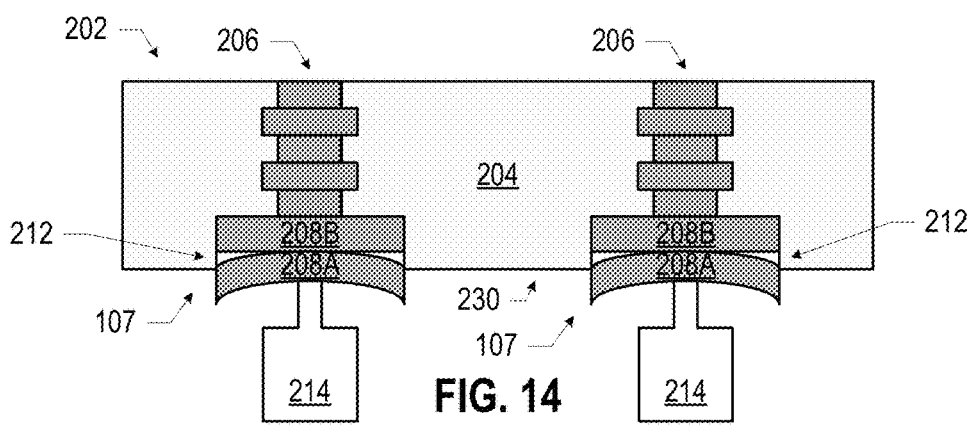

FIGS. 13 and 14 illustrate an example of an ESDP contact structure 107 in an "unused" and an "in use" configuration, respectively. The ESDP contact structure 107 of FIGS. 13 and 14 is an example of an ESDP contact structure 107 that may isolate the signal pathways in the component from voltages present at conductive elements at the face of the component until the component is in use (e.g., during testing or operation). In particular, FIG. 13 is a side, cross-sectional view of a portion of an IC component 202 including two ESDP contact structures 107. The ESDP contact structures 107 include a first contact element 208A exposed at a face 230 of the IC component 202 and a second contact element 208B spaced apart from the first contact element 208A by a gap 212. The first contact element 208A may be supported at its perimeter, as shown. In some embodiments, the first contact element 208A may be an LGA contact. An LGA contact may, in some embodiments, have a diameter that is approximately 1 millimeter. In some embodiments, the gap 212 may be filled with air, while in other embodiments, the gap 212 may be at least partially filled with another electrically insulating material that may be readily deformed to allow the contact elements 208 to form a stable electrical connection, as discussed below. In some embodiments, the gap 212 may be at least partially filed with a pressure sensitive material that becomes significantly more conductive under applied pressure. The second contact element 208B may be electrically coupled to a signal pathway 206 through the dielectric material 204 of the IC component 202. In the configuration illustrated in FIG. 13, the first contact element 208A and the second contact element 208B may be electrically insulated from each other by the intervening gap 212, and thus the second contact element 208B may be substantially "shielded" from exposure to any voltages arising at the face 230 of the IC component 202 by the first contact element 208A.

FIG. 14 is a side, cross-sectional view of the portion of the IC component 202 of FIG. 13 when the ESDP contact structures 107 are brought into contact with external pins 214. These pins 214 may be part of a test fixture (with test signals communicated electrically through the external pins 214 to the ESDP contact structures 107) or part of an LGA socket on another component (e.g., a circuit board, such as a motherboard). Upon coupling of the IC component 202 of FIG. 13 to the test fixture or LGA socket, the external pins 214 may be brought into contact with the first contact element 208A, applying pressure normal to the face 230 and causing the first contact elements 208A to bend through the gap 212 toward the second contact elements 208B, eventually causing the first contact elements 208A to contact their associated second contact elements 208B. In the configuration illustrated in FIG. 14, the electrically insulating gap 212 is bridged, conductively coupling the first contact element 208A with the second contact element 208B, and thereby bringing the first contact element 208A into electrical contact with the signal pathway 206, allowing electrical communication between the external pins 214 and the signal pathways 206. In some embodiments, the bending or other deformation of the first contact element 208A of the ESDP contact structure 107 of FIG. 13 in response to the force applied by the external pins 214 may be reversible (e.g., the material and/or the mechanical structure of the first contact element 208A may have adequate elasticity (e.g., through elastic conductive materials such as nitinol or elastic conductive polymers, and/or through elastic structures such as in-plane or out-of-plane meanders or springs) to return to a configuration in which the first contact element 208A and the second contact element 208B are electrically insulated by the intervening gap 212), while in other embodiments, the bending or other deformation of the first contact element 208A may not be readily reversible (and thus the first contact element 208A may remain in the bent or otherwise deformed configuration even after the force applied by the external pins 214 is removed).

Figure 15:
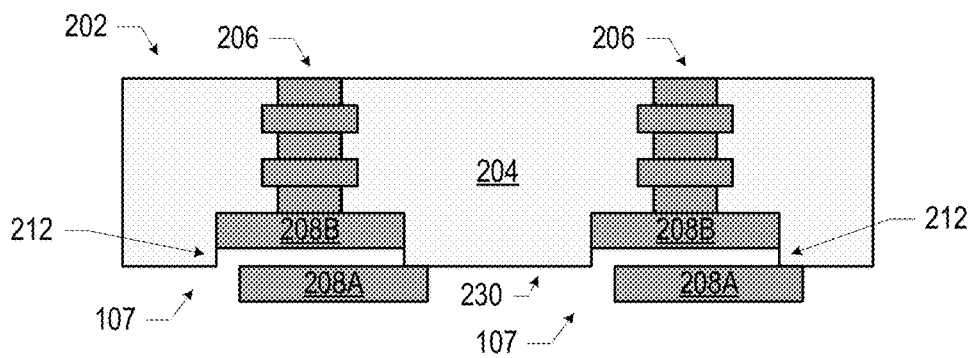
Figure 16:
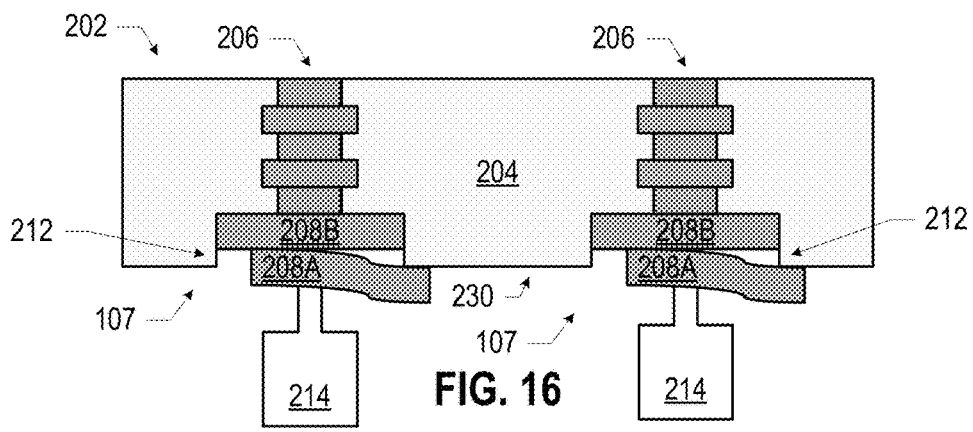

FIGS. 15 and 16 illustrate another example of an ESDP contact structure 107 in an "unused" and an "in use" configuration, respectively. The ESDP contact structure 107 of FIGS. 15 and 16 is an example of an ESDP contact structure 107 that may isolate the signal pathways in the component from voltages present at conductive elements at the face of the component until the component is in use (e.g., during testing or operation). In particular, FIG. 15 is a side, cross-sectional view of a portion of an IC component 202 including two ESDP contact structures 107. The ESDP contact structures 107 include a first contact element 208A exposed at a face 230 of the IC component 202 and a second contact element 208B spaced apart from the first contact element 208A by a gap 212. The first contact element 208A may be cantilevered, as shown. In some embodiments, the first contact element 208A may be an LGA contact. In some embodiments, the gap 212 may be filled with air, while in other embodiments, the gap 212 may be at least partially filled with another electrically insulating material that may be readily deformed to allow the contact elements 208 to form a stable electrical connection, as discussed below. In some embodiments, the gap 212 may be at least partially filed with a pressure sensitive material that becomes significantly more conductive under applied pressure. The second contact element 208B may be electrically coupled to a signal pathway 206 through the dielectric material 204 of the IC component 202. In the configuration illustrated in FIG. 15, the first contact element 208A and the second contact element 208B may be electrically insulated from each other by the intervening gap 212, and thus the second contact element 208B may be substantially "shielded" from exposure to any voltages arising at the face 230 of the IC component 202 by the first contact element 208A.

FIG. 16 is a side, cross-sectional view of the portion of the IC component 202 of FIG. 15 when the ESDP contact structures 107 are brought into contact with external pins 214, which may take any of the forms discussed above with reference to FIGS. 13-14. Upon coupling of the IC component 202 of FIG. 15 to the test fixture or LGA socket, the external pins 214 may be brought into contact with the first contact element 208A, applying pressure normal to the face 230 and causing the first contact elements 208A to bend through the gap 212 toward the second contact elements 208B, eventually causing the first contact elements 208A to contact their associated second contact elements 208B. In the configuration illustrated in FIG. 16, the electrically insulating gap 212 is bridged, conductively coupling the first contact element 208A with the second contact element 208B, and thereby bringing the first contact element 208A into electrical contact with the signal pathway 206, allowing electrical communication between the external pins 214 and the signal pathways 206. In some embodiments, the bending or other deformation of the first contact element 208A of the ESDP contact structure 107 of FIG. 15 in response to the force applied by the external pins 214 may be reversible (e.g., the material or mechanical structure of the first contact element 208A may have adequate elasticity to return to a configuration in which the first contact element 208A and the second contact element 208B are electrically insulated by the intervening gap 212), while in other embodiments, the bending or other deformation of the first contact element 208A may not be readily reversible (and thus the first contact element 208A may remain in the bent or otherwise deformed configuration even after the force applied by the external pins 214 is removed).

Figure 17:
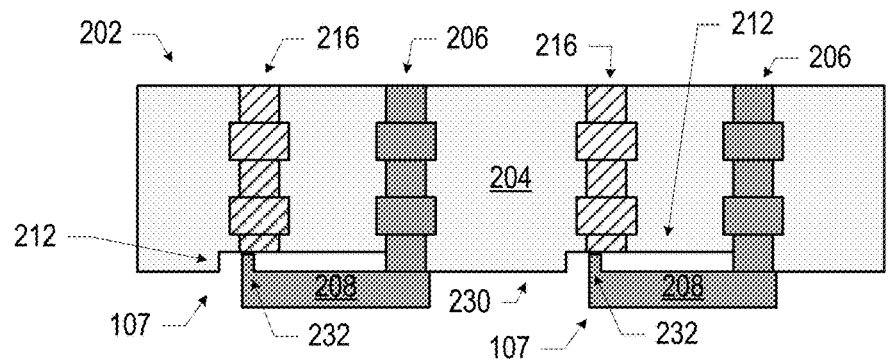
Figure 18:
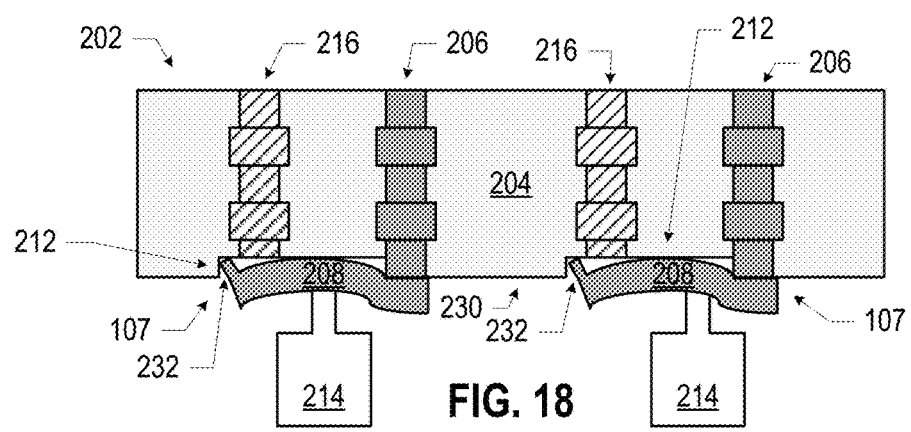

FIGS. 17 and 18 illustrate another example of an ESDP contact structure 107 in an "unused" and an "in use" configuration, respectively. The ESDP contact structure 107 of FIGS. 17 and 18 is an example of an ESDP contact structure 107 that may controllably cause an electrical short between a signal pathway (including, e.g., I/O ports) and a ground pathway when the component is not in use, and may controllably remove the electrical short between the signal pathway and the ground pathway during use of the component in order to permit normal function of the component. In particular, FIG. 17 is a side, cross-sectional view of a portion of an IC component 202 including two ESDP contact structures 107. The ESDP contact structures 107 include a contact element 208 exposed at a face 230 of the IC component 202 and electrically coupled to a signal pathway 206 through the dielectric material 204 of the IC component 202. The contact element 208 may be cantilevered, as shown, and may include a protrusion 232. As shown in FIG. 17, the protrusion 232 may be in contact with a ground pathway 216 through the dielectric material 204 of the IC component 202; thus, in the configuration illustrated in FIG. 17, the contact element 208 may electrically "short" the signal pathway 206 and the ground pathway 216, mitigating the risk of damage to any devices coupled to the signal pathway 206. In some embodiments, the contact element 208 of the ESDP contact structure 107 of FIG. 17 may be an LGA contact. In some embodiments, a gap 212 may be present between the ESDP contact structure 107 and the remainder of the IC component 202; the gap 212 may be filled with air or at least partially filled with another electrically insulating material that may be readily deformed, as discussed below.

FIG. 18 is a side, cross-sectional view of the portion of the IC component 202 of FIG. 17 when the ESDP contact structures 107 are brought into contact with external pins 214, which may take any of the forms discussed above with reference to FIGS. 13-14. Upon coupling of the IC component 202 of FIG. 17 to the test fixture or LGA socket, the external pins 214 may be brought into contact with the contact element 208, applying pressure normal to the face 230 and causing the contact element 208 to bend and sliding the protrusion 232 away from the ground pathway 216 so that the protrusion 232 no longer contacts the ground pathway 216 and thus electrically "disconnecting" the signal pathway 206 from the ground pathway 216, allowing normal operation (e.g., electrical communication between the external pins 214 and the signal pathways 206). In some embodiments, the bending or other deformation of the contact element 208 of the ESDP contact structure 107 of FIG. 17 in response to the force applied by the external pins 214 may be reversible (e.g., the material of the contact element 208 may have adequate elasticity to return to a configuration in which the protrusion 232 is in contact with the ground pathway 216), while in other embodiments, the bending or other deformation of the contact element 208 may not be readily reversible (and thus the contact element 208 may remain in the bent or otherwise deformed configuration even after the force applied by the external pins 214 is removed).

Figure 19:
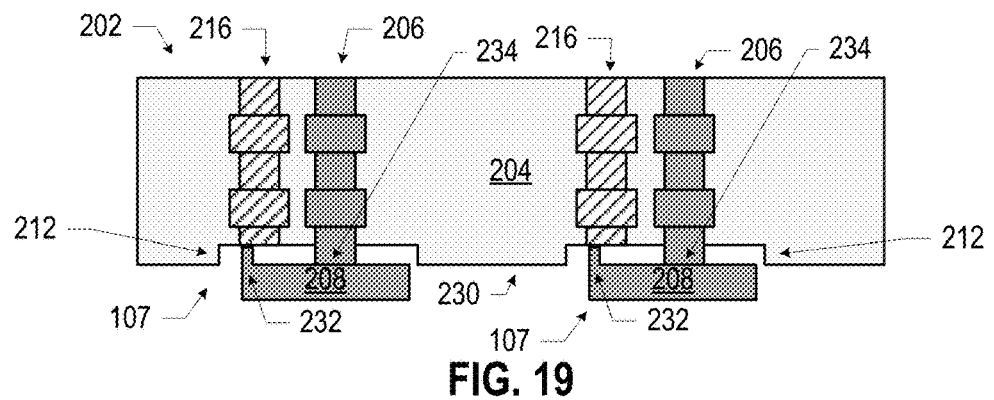
Figure 20:
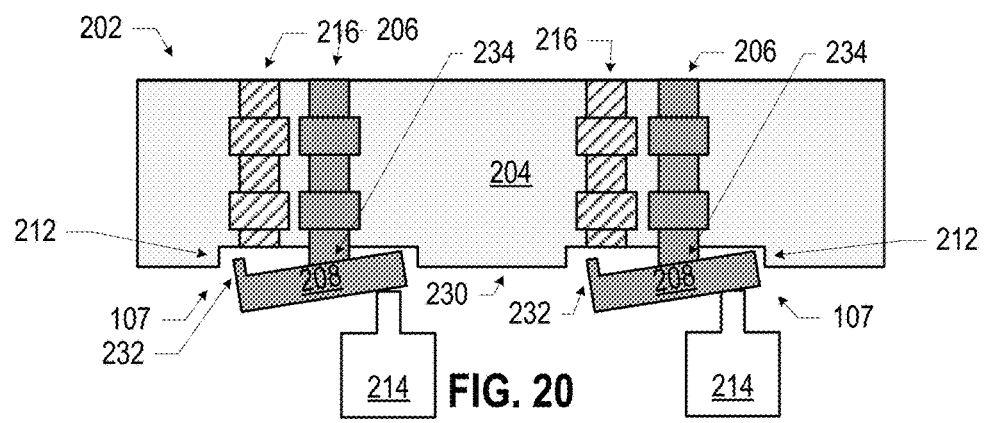

FIGS. 19 and 20 illustrate another example of an ESDP contact structure 107 in an "unused" and an "in use" configuration, respectively. The ESDP contact structure 107 of FIGS. 19 and 20 is an example of an ESDP contact structure 107 that may controllably cause an electrical short between a signal pathway (including, e.g., I/O ports) and a ground pathway when the component is not in use, and may controllably remove the electrical short between the signal pathway and the ground pathway during use of the component in order to permit normal function of the component. In particular, FIG. 19 is a side, cross-sectional view of a portion of an IC component 202 including two ESDP contact structures 107. The ESDP contact structures 107 include a contact element 208 exposed at a face 230 of the IC component 202 and electrically coupled to a signal pathway 206 through the dielectric material 204 of the IC component 202. The contact element 208 may be coupled to the remainder of the IC component 202 at a pivot point 234 spaced away from the perimeter of the contact element 208, as shown, and may include a protrusion 232 at one end. As shown in FIG. 19, the protrusion 232 may be in contact with a ground pathway 216 through the dielectric material 204 of the IC component 202; thus, in the configuration illustrated in FIG. 19, the contact element 208 may electrically "short" the signal pathway 206 and the ground pathway 216, mitigating the risk of damage to any devices coupled to the signal pathway 206. In some embodiments, the contact element 208 of the ESDP contact structure 107 of FIG. 19 may be an LGA contact. In some embodiments, a gap 212 may be present between the ESDP contact structure 107 and the remainder of the IC component 202; the gap 212 may be filled with air or at least partially filled with another electrically insulating material that may be readily deformed, as discussed below.

FIG. 20 is a side, cross-sectional view of the portion of the IC component 202 of FIG. 19 when the ESDP contact structures 107 are brought into contact with external pins 214, which may take any of the forms discussed above with reference to FIGS. 13-14. Upon coupling of the IC component 202 of FIG. 19 to the test fixture or LGA socket, the external pins 214 may be brought into contact with the contact element 208, applying pressure normal to the face 230 at a location opposite from the protrusion 232 relative to the pivot point 234 and causing the contact element 208 to pivot around the pivot point 234 and move the protrusion 232 away from the ground pathway 216 so that the protrusion 232 no longer contacts the ground pathway 216 and thus electrically "disconnecting" the signal pathway 206 from the ground pathway 216, allowing normal operation (e.g., electrical communication between the external pins 214 and the signal pathways 206). In some embodiments, the pivoting of the contact element 208 of the ESDP contact structure 107 of FIG. 19 in response to the force applied by the external pins 214 may be reversible (e.g., the mechanical coupling between the contact element 208 and the remainder of the signal pathway 206 may have adequate elasticity to return to a configuration in which the protrusion 232 is in contact with the ground pathway 216), while in other embodiments, the pivoting of the contact element 208 may not be readily reversible (and thus the contact element 208 may remain disconnected from the ground pathway 216 even after the force applied by the external pins 214 is removed).

Figure 21:
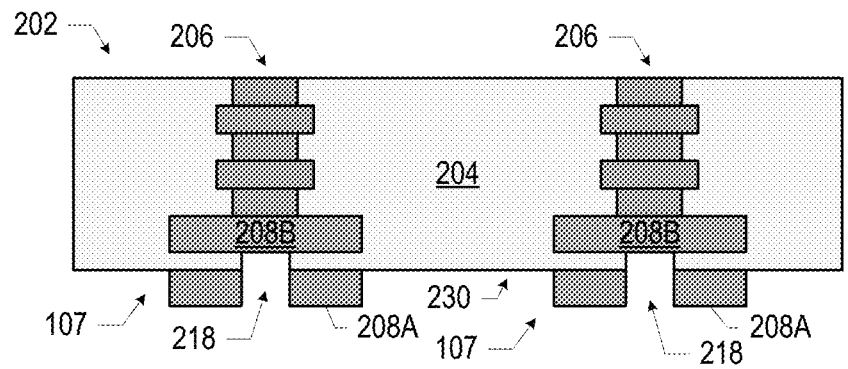
Figure 22:
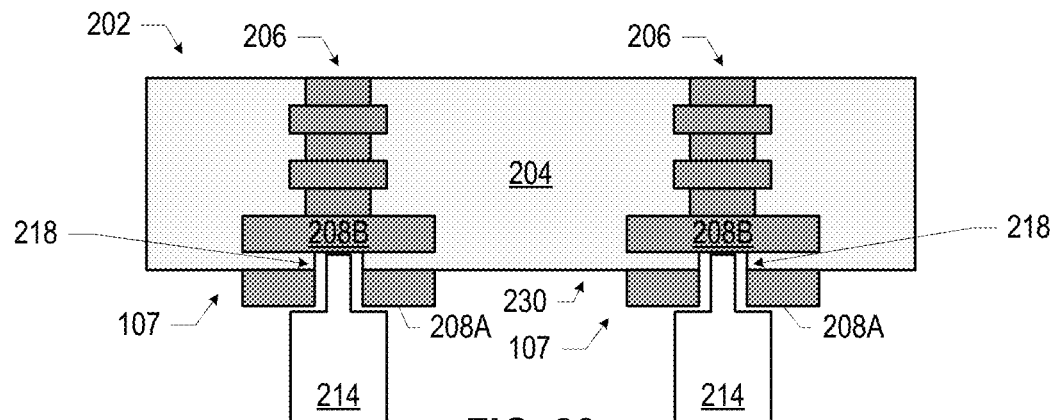
Figure 23:
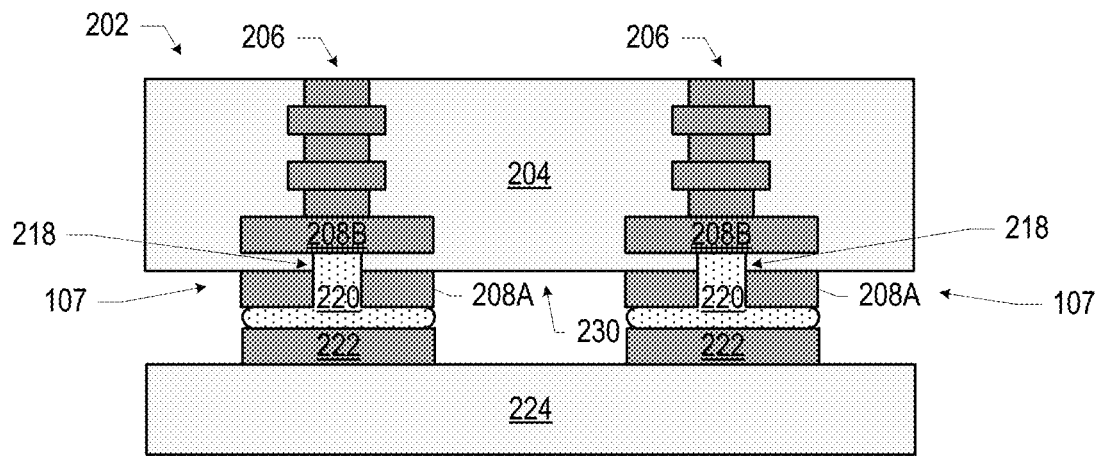

FIGS. 21-23 illustrate an example of an ESDP contact structure 107 in an "unused," "test," and an "in assembly" configuration, respectively. The ESDP contact structure 107 of FIGS. 21-23 is an example of an ESDP contact structure 107 that may isolate the signal pathways in the component from voltages present at conductive elements at the face of the component until the component is in use (e.g., during testing or operation). In particular, FIG. 21 is a side, cross-sectional view of a portion of an IC component 202 including two ESDP contact structures 107. The ESDP contact structures 107 include a first contact element 208A exposed at a face 230 of the IC component 202 and a second contact element 208B spaced apart from the first contact element 208A (e.g., in part by a dielectric material, such as the dielectric material 204). The first contact element 208A may include an opening 218 through which a surface of the second contact element 208B is exposed. In some embodiments, the first contact element 208A may be a BGA contact. The second contact element 208B may be electrically coupled to a signal pathway 206 through the dielectric material 204 of the IC component 202. In the configuration illustrated in FIG. 21, the first contact element 208A and the second contact element 208B may be electrically insulated from each other by the intervening material, and thus the second contact element 208B may be substantially "shielded" from exposure to any voltages arising at the face 230 of the IC component 202 by the first contact element 208A.

FIG. 22 is a side, cross-sectional view of the portion of the IC component 202 of FIG. 21 when the ESDP contact structures 107 are brought into contact with external pins 214. These pins 214 may be part of a test fixture (with test signals communicated electrically through the external pins 214 to the ESDP contact structures 107), for example. Upon coupling of the IC component 202 of FIG. 21 to the test fixture, the external pins 214 may extend through the openings 218 in the first contact elements 208A and may be brought into physical and electrical contact with the second contact elements 208B, allowing electrical communication between the external pins 214 and the signal pathways 206. In some embodiments, the width of an opening 218 (e.g., the smallest dimension through which an external pin 214 is to extend) may be between 25 microns and 250 microns (e.g., between 50 microns and 150 microns).

FIG. 23 is a side, cross-sectional view of the portion of the IC component 202 of FIG. 21 when the ESDP contact structures 107 are coupled to conductive contacts 222 of another IC component 224 by a solder material 220 (e.g., a solder paste). The other IC component 224 may be a circuit board (e.g., a motherboard) or another suitable component, and the conductive contacts 222 may be BGA contacts. Upon coupling of the IC component 202 of FIG. 21 to the IC component 224 by a solder material 220, the solder material 220 may physically and electrically couple the first contact elements 208A to the conductive contacts 222, and may "wick" up into the openings 218 to contact the second contact elements 208B, thereby conductively coupling the conductive contacts 222 and the first contact elements 208A with the second contact elements 208B and allowing electrical communication between the conductive contacts 222 of the IC component 224 and the signal pathways 206 of the IC component 202. In some embodiments, the first contact elements 208A may provide improved mechanical support for the package or solder, or improved underfill coverage, relative to embodiments including only the "buried" second contact elements 208B.

The first contact elements 208A of the ESDP contact structures 107 of FIGS. 21-23 may take any of a number of forms, any of a number of which may advantageously permit escape of air and movement of the solder material 220 during attachment between the IC component 202 and the IC component 224. For example, FIG. 24 illustrates an embodiment in which the first contact element 208A has a substantially circular footprint with a cross-shaped opening 218 therein. FIG. 25 illustrates an embodiment in which the opening 218 has a central circular portion and a channel extending therefrom. FIG. 26 illustrates an embodiment including a substantially circular opening 218. FIG. 27 illustrates an embodiment in which the opening 218 does not extend all the way to the center of the first contact element 208A; any of the openings 218 disclosed herein may be offset from the center of the first contact element 208A as suitable for alignment with the pins 214 of a test fixture. FIG. 28 illustrates an embodiment in which the opening 218 takes the form of a channel extending across the first contact element 208A. FIG. 29 illustrates an embodiment in which the first contact element 208A does not have a substantially circular footprint, but instead has a rectangular footprint; more generally, the footprint of the first contact element 208A in an ESDP contact structure 107 may have any desired shape, as may the opening 218.

FIGS. 30-31 illustrate another example of an ESDP contact structure 107 in an "unused" and an "in use" configuration, respectively. The ESDP contact structure 107 of FIGS. 30-31 is an example of an ESDP contact structure 107 that may controllably cause an electrical short between a signal pathway (including, e.g., I/O ports) and a ground pathway when the component is not in use, and may controllably remove the electrical short between the signal pathway and the ground pathway during use of the component in order to permit normal function of the component. In particular, FIG. 30 is a side, cross-sectional view of a portion of an IC component 202 including two ESDP contact structures 107. The ESDP contact structures 107 include a contact element 208 exposed at a face 230 of the IC component 202 and electrically coupled to a signal pathway 206 through the dielectric material 204 of the IC component 202. The contact element 208 may be a BGA contact. The ESDP contact structure 107 may also include an auxiliary element 226 proximate to the contact element 208 at the face 230. In some embodiments, an auxiliary element 226 may be spaced apart from an associated contact element 208 by a distance between 10 microns and 50 microns. The auxiliary element 226 include any of the materials discussed herein with reference to the contact elements 208, but may have a smaller diameter than the contact element 208 to which it is proximate. Further, the auxiliary element 226 may have any suitable footprint shape (e.g., circular, triangular, crescent-shaped, etc.), as may the contact element 208 (e.g., circular, rectangular, etc.). The auxiliary element 226 may be electrically coupled to a ground pathway 216 through the dielectric material 204 of the IC component 202. A solder material 220 may be disposed on the ESDP contact structure 107 such that a single portion of solder material is in contact with both the auxiliary element 226 and the contact element 208. The solder material 220 may thus electrically "short" the signal pathway 206 (via the contact element 208) and the ground pathway 216 (via the auxiliary element 226), mitigating the risk of damage to any devices coupled to the signal pathway 206.

FIG. 31 is a side, cross-sectional view of the portion of the IC component 202 of FIG. 30 when the ESDP contact structures 107 are coupled to conductive contacts 222 of another IC component 224 by a solder material 220 (e.g., a solder paste). The other IC component 224 and the conductive contacts 222 may take any of the forms discussed above with reference to FIG. 23. Upon coupling of the IC component 202 of FIG. 30 to the IC component 224 by the solder material 220 during a reflow process, the surface tension of the solder material 220 may cause the solder material 220 to separate into a greater portion between the contact element 208 and the corresponding conductive contact 222, and a lesser (if any) portion on the auxiliary element 226. The IC component 224 may not include any conductive contacts that are intended to conductive couple to the auxiliary elements 226, and thus the auxiliary elements 226 may be "unused" in the assembly of FIG. 31. Removing the conductive "bridge" provided the solder material 220 in the configuration of FIG. 30 may electrically "disconnect" the signal pathway 206 from the ground pathway 216, and the solder material 220 between the conductive contacts 222 and the contact elements 208 may allow electrical communication between the conductive contacts 222 of the IC component 224 and the signal pathways 206 of the IC component 202.

The IC structures 100, IC assemblies 150, IC package supports 168, and/or ESDP contact structures 107 disclosed herein may include, or may be included in, any suitable electronic component. FIGS. 32-34 illustrate various examples of apparatuses that may include, or be included in, any of the IC structures 100, IC assemblies 150, IC package supports 168, and/or ESDP contact structures 107 disclosed herein, as appropriate.

FIG. 32 is a top view of a wafer 1500 and dies 1502 that may include one or more IC structures 100, or may be included in any suitable ones of the IC assemblies 150, IC package supports 168, and/or ESDP contact structures 107 disclosed herein. The wafer 1500 may be composed of a material (e.g., a semiconductor material) and may include one or more dies 1502 having structures formed on a surface of the wafer 1500. Each of the dies 1502 may be a repeating unit of a product that includes any suitable circuitry. After the fabrication of the product is complete, the wafer 1500 may undergo a singulation process in which the dies 1502 are separated from one another to provide discrete "chips" of the semiconductor product. In some embodiments, the die 1502 may include any of the IC structures 100 disclosed herein (e.g., the material of the wafer 1500 may be part of the substrate 102). In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 34) or other logic that is configured to store information in the memory devices or execute instructions stored in the memory array.

FIG. 33 is a side, cross-sectional view of an IC device assembly 1700 that may include any of the IC structures 100, IC assemblies 150, IC package supports 168, and/or ESDP contact structures 107 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the IC assemblies 150, IC package supports 168, and/or ESDP contact structures 107 disclosed herein.

In some embodiments, the circuit board 1702 may be a PCB including multiple metal layers separated from one another by layers of organic dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 33 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 33), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 33, multiple IC packages may be coupled to the package interposer 1704; indeed, additional interposers may be coupled to the package interposer 1704. The package interposer 1704 may provide an intervening substrate used to bridge the circuit board 1702 and the IC package 1720. Generally, the package interposer 1704 may spread a connection to a wider pitch or reroute a connection to a different connection. For example, the package interposer 1704 may couple the IC package 1720 to a set of BGA conductive contacts of the coupling components 1716 for coupling to the circuit board 1702. In the embodiment illustrated in FIG. 33, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group IIII-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers (PAs), power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 33 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

FIG. 34 is a block diagram of an example electrical device 1800 that may include one or more IC structures 100, IC assemblies 150, IC package supports 168, and/or ESDP contact structures 107, in accordance with any of the embodiments disclosed herein. For example, any suitable ones of the components of the electrical device 1800 may include one or more of the IC device assemblies 1700 or dies 1502 disclosed herein. A number of components are illustrated in FIG. 34 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 34, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include communication circuitry 1812. For example, the communication circuitry 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication circuitry 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication circuitry 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication circuitry 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication circuitry 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication circuitry 1812 may operate in accordance with other wireless protocols in other embodiments. The electrical device 1800 may include an antenna 1822 to facilitate wireless communications and/or to receive other wireless communications (such as AM or FM radio transmissions). The communication circuitry 1812 may include any of the IC structures 100, IC assemblies 150, IC package supports 168, and/or ESDP contact structures 107 disclosed herein.

In some embodiments, the communication circuitry 1812 may manage wired communications, such as electrical, optical, or any other suitable communication protocols (e.g., the Ethernet). As noted above, the communication circuitry 1812 may include multiple communication chips. For instance, a first communication circuitry 1812 may be dedicated to shorter-range wireless communications such as Wi-Fi or Bluetooth, and a second communication circuitry 1812 may be dedicated to longer-range wireless communications such as global positioning system (GPS), EDGE, GPRS, CDMA, WiMAX, LTE, EV-DO, or others. In some embodiments, a first communication circuitry 1812 may be dedicated to wireless communications, and a second communication circuitry 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) component, including a conductive contact structure that includes: a first contact element, wherein the first contact element is exposed at a face of the IC component; and a second contact element, wherein the first contact element is between the face of the IC component and the second contact element, the second contact element is spaced apart from the first contact element by a gap, and the second contact element is in electrical contact with an electrical pathway in the IC component.

Example 2 includes the subject matter of Example 1, and further specifies that the first contact element is deformable to contact the second contact element.

Example 3 includes the subject matter of any of Examples 1-2, and further specifies that the first contact element is a land grid array (LGA) contact.

Example 4 includes the subject matter of any of Examples 1-3, and further specifies that the gap includes air.

Example 5 includes the subject matter of any of Examples 1-4, and further specifies that the first contact element is a cantilevered contact element.

Example 6 includes the subject matter of Example 1, and further specifies that a portion of a face of the second contact element is exposed through an opening in the second contact element.

Example 7 includes the subject matter of Example 6, and further specifies that the gap includes a dielectric material.

Example 8 includes the subject matter of Example 7, and further specifies that the dielectric material includes an organic dielectric material.

Example 9 includes the subject matter of any of Examples 6-8, and further specifies that the opening has a width between 50 microns and 200 microns.

Example 10 includes the subject matter of any of Examples 6-9, and further specifies that the first contact element is a ball grid array (BGA) contact.

Example 11 includes the subject matter of any of Examples 1-10, and further specifies that the first contact element includes gold.

Example 12 includes the subject matter of any of Examples 1-11, and further specifies that the electrical pathway is a signal pathway.

Example 13 includes the subject matter of any of Examples 1-12, and further specifies that the IC component is a package substrate or an interposer.

Example 14 includes the subject matter of any of Examples 1-13, and further includes: an organic dielectric material proximate to the electrical pathway.

Example 15 is an integrated circuit (IC) component, including a conductive contact structure that includes a contact element exposed at a face of the IC component, wherein the contact element is in electrical contact with a first electrical pathway in the IC component, and a portion of the contact element is in adjustable physical contact with a second electrical pathway in the IC component.

Example 16 includes the subject matter of Example 15, and further specifies that the contact element is deformable to adjustably physically contact the second electrical pathway.

Example 17 includes the subject matter of any of Examples 15-16, and further specifies that adjustable physical contact includes adjustability between a configuration in which the portion of the contact element is in physical contact with the second electrical pathway and a configuration in which the portion of the contact element is not in physical contact with the second electrical pathway.

Example 18 includes the subject matter of Example 17, and further specifies that application of a force normal to the face of the IC component is to adjust the physical contact between the portion of the contact element and the second electrical pathway.

Example 19 includes the subject matter of any of Examples 17-18, and further specifies that the contact element is cantilevered.

Example 20 includes the subject matter of any of Examples 17-18, and further specifies that the contact element has a pivot point away from an edge of the contact element.

Example 21 includes the subject matter of any of Examples 15-20, and further specifies that the portion of the contact element includes a protrusion normal to a plane of the contact element.

Example 22 includes the subject matter of any of Examples 15-21, and further specifies that the conductive contact structure includes an air gap between the contact element and a dielectric material of the IC component.

Example 23 includes the subject matter of Example 22, and further specifies that the dielectric material includes an organic dielectric material.

Example 24 includes the subject matter of any of Examples 15-23, and further specifies that the contact element includes gold.

Example 25 includes the subject matter of any of Examples 15-24, and further specifies that the first electrical pathway is a signal pathway, and the second electrical pathway is a ground pathway.

Example 26 includes the subject matter of any of Examples 15-25, and further specifies that the IC component is a package substrate.

Example 27 includes the subject matter of any of Examples 15-25, and further specifies that the IC component is an interposer.

Example 28 includes the subject matter of any of Examples 15-27, and further specifies that the contact element is a land grid array (LGA) contact.

Example 29 is an integrated circuit (IC) component, including a conductive contact structure that includes: a contact element exposed at a face of the IC component, wherein the contact element is in electrical contact with a first electrical pathway in the IC component; an auxiliary element exposed at the face of the IC component and spaced apart from the contact element, wherein the auxiliary element is in electrical contact with a second electrical pathway in the IC component; and a solder material in contact with the auxiliary element and the contact element.

Example 30 includes the subject matter of Example 29, and further specifies that the auxiliary element has a smaller surface area than the contact element.

Example 31 includes the subject matter of any of Examples 29-30, and further specifies that the auxiliary element is spaced apart from the contact element by a distance between 10 microns and 20 microns.

Example 32 includes the subject matter of any of Examples 29-31, and further specifies that the contact element includes gold.

Example 33 includes the subject matter of any of Examples 29-32, and further specifies that the first electrical pathway is a signal pathway, and the second electrical pathway is a ground pathway.

Example 34 includes the subject matter of any of Examples 29-33, and further specifies that the IC component is a package substrate.

Example 35 includes the subject matter of any of Examples 29-33, and further specifies that the IC component is an interposer.

Example 36 includes the subject matter of any of Examples 29-35, and further specifies that the contact element is a ball grid array (BGA) contact.

Example 37 is an integrated circuit (IC) assembly, including: a first IC component, wherein the first IC component includes a conductive contact structure, and the conductive contact structure includes a first contact element, wherein the first contact element is exposed at a face of the IC component, and a second contact element, wherein the first contact element is between the face of the IC component and the second contact element, and the second contact element is in electrical contact with an electrical pathway in the IC component; and a second IC component coupled to the first IC component, wherein a pin of the second IC component is in contact with the first contact element to cause the first contact element to be in contact with the second contact element.

Example 38 includes the subject matter of Example 37, and further specifies that the first contact element is a land grid array (LGA) contact.

Example 39 includes the subject matter of any of Examples 37-38, and further specifies that air is present between the first contact element and the second contact.

Example 40 includes the subject matter of any of Examples 37-39, and further specifies that the first contact element is a cantilevered contact element.

Example 41 includes the subject matter of any of Examples 37-40, and further specifies that the first contact element includes gold.

Example 42 includes the subject matter of any of Examples 37-41, and further specifies that the electrical pathway is a signal pathway.

Example 43 includes the subject matter of any of Examples 37-42, and further specifies that the first IC component is a package substrate or an interposer.

Example 44 includes the subject matter of any of Examples 37-43, and further specifies that the first IC component includes an organic dielectric material proximate to the electrical pathway.

Example 45 includes the subject matter of any of Examples 37-44, and further specifies that the second IC component is a circuit board.

Example 46 includes the subject matter of any of Examples 37-45, and further specifies that the pin is part of a socket of the second IC component.

Example 47 is an integrated circuit (IC) assembly, including: a first IC component, wherein the first IC component includes a conductive contact structure, and the conductive contact structure includes a first contact element, wherein the first contact element is exposed at a face of the IC component, and a second contact element, wherein the first contact element is between the face of the IC component and the second contact element, the second contact element is spaced apart from the first contact element by a gap, and the second contact element is in electrical contact with an electrical pathway in the IC component; and a second IC component coupled to the first IC component, wherein a conductive contact of the second IC component is coupled to the conductive structure by a solder material, and the solder material is in contact with the first contact element and the second contact element.

Example 48 includes the subject matter of Example 47, and further specifies that a portion of a face of the second contact element is exposed through an opening in the second contact element.

Example 49 includes the subject matter of Example 48, and further specifies that the opening has a width between 50 microns and 200 microns.

Example 50 includes the subject matter of any of Examples 47-49, and further specifies that the gap includes a dielectric material.

Example 51 includes the subject matter of Example 50, and further specifies that the dielectric material includes an organic dielectric material.

Example 52 includes the subject matter of any of Examples 47-51, and further specifies that the first contact element is a ball grid array (BGA) contact.

Example 53 includes the subject matter of any of Examples 47-52, and further specifies that the first contact element includes gold.

Example 54 includes the subject matter of any of Examples 47-53, and further specifies that the electrical pathway is a signal pathway.

Example 55 includes the subject matter of any of Examples 47-54, and further specifies that the IC component is a package substrate or an interposer.

Example 56 includes the subject matter of any of Examples 47-55, and further specifies that the IC component further includes an organic dielectric material proximate to the electrical pathway.

Example 57 includes the subject matter of any of Examples 47-56, and further specifies that the second IC component is a circuit board.

Example 58 is an integrated circuit (IC) assembly, including: a first IC component, wherein the first IC component includes a conductive contact structure, the conductive contact structure includes a contact element exposed at a face of the IC component, the contact element is in electrical contact with a first electrical pathway in the IC component, and a portion of the contact element is in adjustable physical contact with a second electrical pathway in the IC component; and a second IC component coupled to the first IC component, wherein a pin of the second IC component is in contact with the contact element to cause the contact element to not be in physical contact with the second electrical pathway.

Example 59 includes the subject matter of Example 58, and further specifies that the pin applies a force normal to the face of the IC component to the contact structure.

Example 60 includes the subject matter of any of Examples 58-59, and further specifies that the contact element is cantilevered.

Example 61 includes the subject matter of any of Examples 58-59, and further specifies that the contact element has a pivot point away from an edge of the contact element.

Example 62 includes the subject matter of any of Examples 58-61, and further specifies that the portion of the contact element includes a protrusion normal to a plane of the contact element.

Example 63 includes the subject matter of any of Examples 58-62, and further specifies that the conductive contact structure includes an air gap between the contact element and a dielectric material of the IC component.

Example 64 includes the subject matter of Example 63, and further specifies that the dielectric material includes an organic dielectric material.

Example 65 includes the subject matter of any of Examples 58-64, and further specifies that the contact element includes gold.

Example 66 includes the subject matter of any of Examples 58-65, and further specifies that the first electrical pathway is a signal pathway, and the second electrical pathway is a ground pathway.

Example 67 includes the subject matter of any of Examples 58-66, and further specifies that the IC component is a package substrate.

Example 68 includes the subject matter of any of Examples 58-67, and further specifies that the IC component is an interposer.

Example 69 includes the subject matter of any of Examples 58-68, and further specifies that the contact element is a land grid array (LGA) contact.

Example 70 includes the subject matter of any of Examples 58-69, and further specifies that the second IC component is a circuit board.

Example 71 includes the subject matter of any of Examples 58-70, and further specifies that the pin is part of a socket of the second IC component.

Example 72 is an integrated circuit (IC) assembly, including: a first IC component, wherein the first IC component includes a conductive contact structure, and the conductive contact structure includes a contact element exposed at a face of the IC component, wherein the contact element is in electrical contact with a first electrical pathway in the IC component, an auxiliary element exposed at the face of the IC component and spaced apart from the contact element, wherein the auxiliary element is in electrical contact with a second electrical pathway in the IC component; and a second IC component coupled to the first IC component, wherein a conductive contact of the second IC component is coupled to the contact element by a solder material, the auxiliary element has a smaller diameter than the contact element, and the auxiliary element is spaced apart from the contact element by a distance between 10 microns and 20 microns.

Example 73 includes the subject matter of Example 72, and further specifies that the contact element includes gold.

Example 74 includes the subject matter of any of Examples 72-73, and further specifies that the first electrical pathway is a signal pathway, and the second electrical pathway is a ground pathway.

Example 75 includes the subject matter of any of Examples 72-74, and further specifies that the IC component is a package substrate.

Example 76 includes the subject matter of any of Examples 72-74, and further specifies that the IC component is an interposer.

Example 77 includes the subject matter of any of Examples 72-76, and further specifies that the contact element is a ball grid array (BGA) contact.

Example 78 includes the subject matter of any of Examples 72-77, and further specifies that the second IC component is a circuit board.

Example 79 is a computing device, including any of the IC components or assemblies disclosed herein.

Example 80 includes the subject matter of Example 79, and further includes: an antenna electrically coupled to the IC component or IC assembly.

Example 81 includes the subject matter of any of Examples 79-80, and further includes: a display device electrically coupled to the IC component or IC assembly.

Example 82 includes the subject matter of any of Examples 79-81, and further specifies that the computing device is a handheld computing device.

Example 83 includes the subject matter of any of Examples 79-81, and further specifies that the computing device is a wearable computing device.

Example 84 includes the subject matter of any of Examples 79-81, and further specifies that the computing device is a server computing device.

The invention claimed is:

1. An integrated circuit (IC) component, comprising:
    a conductive contact structure, including:
        a first contact element; and
        a second contact element, wherein:
            the first contact element is exposed at a face of the IC component,
            the first contact element is between the face of the IC component and the second contact element,
            the second contact element is spaced apart from the first contact element by a gap,
            the second contact element is in electrical contact with an electrical pathway in the IC component, and
            the first contact element is deformable to contact the second contact element.

2. The IC component of claim 1, wherein the first contact element is a land grid array (LGA) contact.

3. The IC component of claim 1, wherein the gap includes air.

4. The IC component of claim 1, wherein the first contact element is a cantilevered contact element.

5. The IC component of claim 1, wherein a portion of a face of the second contact element is exposed through an opening in the first contact element.

6. The IC component of claim 5, wherein the first contact element is a ball grid array (BGA) contact.

7. The IC component of claim 1, further comprising:
an organic dielectric material proximate to the electrical pathway.

8. The IC component of claim 1, wherein the gap includes a dielectric material.

9. The IC component of claim 8, wherein the dielectric material is an organic material.

10. The IC component of claim 1, wherein the first contact element includes gold.

11. The IC component of claim 1, wherein the first contact element is reversibly deformable.

12. The IC component of claim 1, wherein the IC component is a package substrate or an interposer.

13. The IC component of claim 1, wherein the gap includes pressure sensitive material that is conductive under pressure.

14. The IC component of claim 1, wherein the first contact element is deformable by bending through the gap.

\* \* \* \* \*